US009647082B2

(12) United States Patent
Lin et al.

(10) Patent No.: US 9,647,082 B2
(45) Date of Patent: May 9, 2017

(54) DIODES WITH MULTIPLE JUNCTIONS

(71) Applicant: NXP USA, Inc., Austin, TX (US)

(72) Inventors: Xin Lin, Phoenix, AZ (US); Daniel J. Blomberg, Chandler, AZ (US); Hongning Yang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/365,530

(22) Filed: Nov. 30, 2016

(65) Prior Publication Data

US 2017/0084715 A1 Mar. 23, 2017

Related U.S. Application Data

(62) Division of application No. 14/832,379, filed on Aug. 21, 2015, now Pat. No. 9,543,454.

(51) Int. Cl.
| | |
|---|---|
| *H01L 21/331* | (2006.01) |
| *H01L 21/8222* | (2006.01) |
| *H01L 21/8238* | (2006.01) |
| *H01L 29/66* | (2006.01) |
| *H01L 29/866* | (2006.01) |
| *H01L 29/06* | (2006.01) |
| *H01L 21/266* | (2006.01) |
| *H01L 21/265* | (2006.01) |

(52) U.S. Cl.
CPC ...... *H01L 29/66106* (2013.01); *H01L 21/266* (2013.01); *H01L 21/26513* (2013.01); *H01L 29/0615* (2013.01); *H01L 29/0649* (2013.01); *H01L 29/866* (2013.01)

(58) Field of Classification Search
CPC ............. H01L 21/266; H01L 21/26513; H01L 29/66106; H01L 29/866
USPC .................................................. 438/201, 311
See application file for complete search history.

(56) References Cited

U.S. PATENT DOCUMENTS

| | | | | |
|---|---|---|---|---|
| 9,093,567 B2 * | 7/2015 | Lin | ........................ | H01L 29/861 |
| 2003/0148574 A1 * | 8/2003 | Thomas | ............... | H01L 27/1462 |
| | | | | 438/201 |
| 2014/0231961 A1 * | 8/2014 | Lin | ........................ | H01L 29/73 |
| | | | | 257/565 |

* cited by examiner

*Primary Examiner* — David S Blum

(57) ABSTRACT

A diode includes a semiconductor substrate having a surface; a first contact region disposed at the surface of the semiconductor substrate and having a first conductivity type; and a second contact region disposed at the surface, laterally spaced from the first contact region, and having a second conductivity type. The diode also includes a buried region disposed in the semiconductor substrate vertically adjacent to the first contact region, having the second conductivity type, and electrically connected with the second contact region; and an isolation region disposed at the surface between the first and second contact regions. The diode also includes a separation region disposed at the surface between the first contact region and the isolation region, the separation region formed from a portion of a first well region disposed in the semiconductor substrate that extends to the surface.

15 Claims, 15 Drawing Sheets

DIODES WITH MULTIPLE JUNCTIONS

CROSS-REFERENCE TO RELATED APPLICATIONS

This application is a divisional of U.S. patent application Ser. No. 14/832,379, now U.S. Pat. No. 9,543,454, having a filing date of Aug. 21, 2015, common inventors, and common assignee, which is incorporated by reference in its entirety.

BACKGROUND

Field

This disclosure relates generally to semiconductor devices, and more specifically, to diodes having multiple junctions.

Related Art

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Power transistor devices are designed to be tolerant of the high currents and voltages that are present in power applications such as motion control, air bag deployment, and automotive fuel injector drivers. One type of power transistor is a laterally diffused metal-oxide-semiconductor (LD-MOS) transistor. Power transistor devices may have a number of features customized to prevent breakdown resulting from the high electric fields arising from such high voltages. Power transistor devices are often combined in ICs with low voltage FET transistor devices. The low voltage devices provide logic or analog functionality to support the operation of the high voltage devices.

The fabrication process flow is thus configured with a considerable number of dopant implantation and other procedures directed to creating features specific to the high voltage FET devices and the low voltage FET devices. The procedures may be highly customized to optimize the features of the high and low voltage devices. The customization of the procedures may not be conducive to fabricating conventional designs of other semiconductor devices, such as diodes, in the same process flow. Diodes are electronic components that are also utilized to control current flow, depending on how the diode is biased. The customization of the procedures may also result in expenses that leave little, if any, resources for implementing procedures customized for fabricating such other semiconductor devices.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Diodes can often withstand high voltages, such as 7V. Due to process variation, a number of such diodes may suffer from high leakage current, especially in diode arrays having a long width and multiple fingers, which results in significant yield loss. As indicated by top-down scanning electron microscopy (SEM), high leakage current in outlier diodes often arises from crystalline defects that are located at sub-surface close to an edge of an isolation region (e.g., shallow trench isolation (STI) region) that abuts an anode active area. Such defects indicate that stress interactions along the isolation region edge and high dopant concentration implants in the anode active area may be at fault.

The present disclosure provides for a diode having multiple vertical junctions and lateral junction utilizing implantation procedures used to fabricate FET devices. The presently disclosed diode includes high dopant concentration implants (e.g., heavy shallow implants, heavy well implants) in an anode active area, and "pulls" the high dopant concentration implants away from the edge of the isolation region to minimize interaction between the high dopant concentration implants and the isolation region edge. The presently disclosed diode also includes a low dopant concentration region between the diode's anode active area and the isolation region, and its dopant concentration can be further reduced by counter-doping. The presently disclosed diode provides improved stability upon electrical stress, resulting in a diode that is less sensitive to process variation and has minimized leakage current.

Example Embodiments

Figure 1:
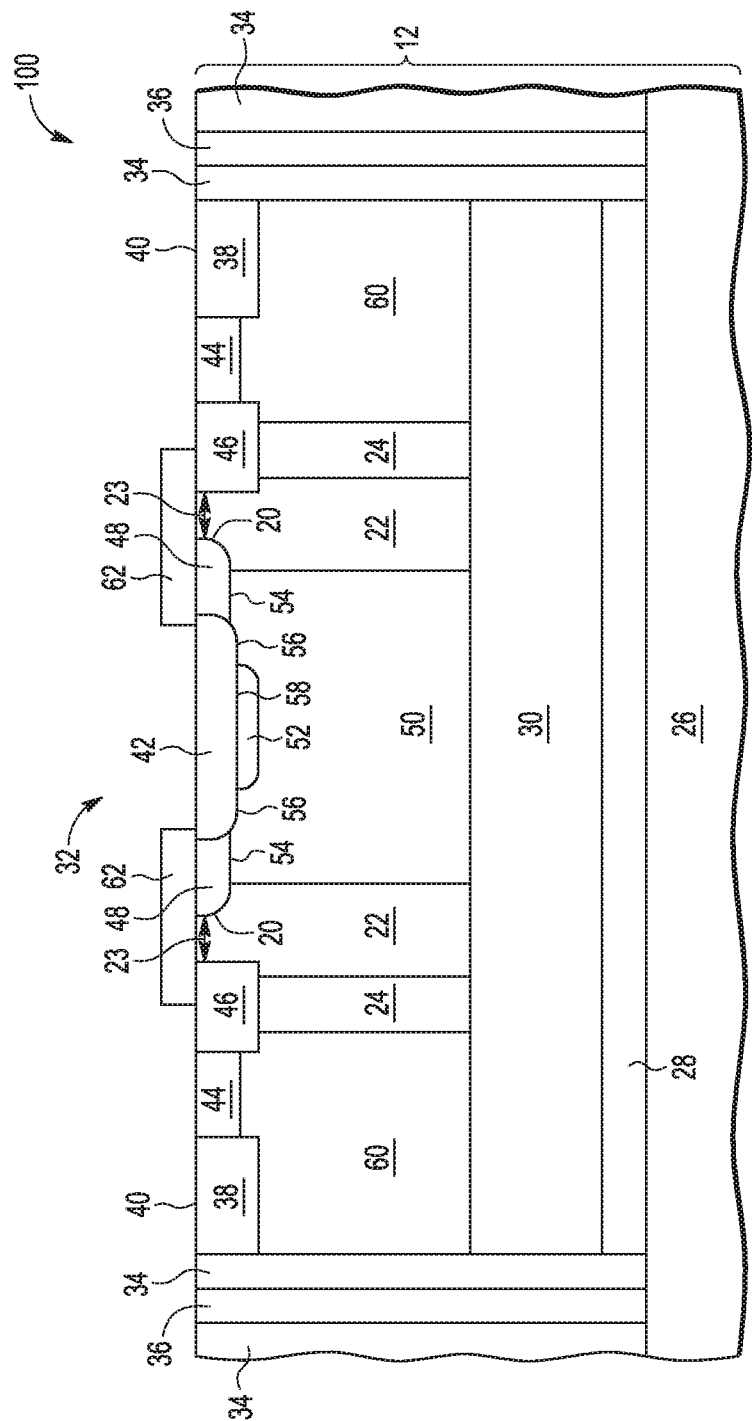
FIG. 1 illustrates a block diagram depicting a cross-sectional view of an example diode having multiple junctions in which the disclosure is implemented, according to some embodiments.

FIG. 1 is a cross-sectional view of an example diode 100. The diode 100 is shown in simplified form and, thus, FIG. 1 does not show the conductive (e.g., ohmic) contacts and other metal layers of the electrodes of the diode 100 and interconnects. The diode 100 may have a number of other structures or components for connectivity, isolation, passivation, and other purposes that are not shown in FIG. 1 for ease of illustration and explanation.

Device Regions

Diode 100 is implemented in a semiconductor substrate 12, which may, in turn, include a number of epitaxial layers 30. In the embodiment shown in FIG. 1, the semiconductor substrate 12 includes a single p-type epitaxial layer grown on a base or original substrate 26. The original substrate 26 may include a lightly or heavily doped n-type or p-type bulk substrate, e.g., a handle wafer, and may include one or more epitaxial layers. In the embodiment shown, a lightly doped n-type substrate may be used. Diode 100 may alternatively or additionally include non-epitaxial layers in which one or more device regions are formed. Any one or more of the layers of the semiconductor substrate 12 may include silicon. Other semiconductor materials may be used, including both elementary and compound semiconductor materials.

In the embodiment shown in FIG. 1, the semiconductor substrate 12 has a silicon-on-insulator (SOI) construction having a buried insulator layer 28. The buried insulator layer 28 may include a silicon oxide layer having a thickness of, e.g., about 0.3 microns ($\mu m$), but other thicknesses, materials, and layers may be used. Silicon may be deposited over the buried insulator layer 28 and doped to define a seed layer (not shown) for growth of the epitaxial layer 30. In other embodiments, a buried silicon oxide is created by an oxygen ion beam implantation process followed by high temperature annealing. The seed layer may have a thickness of, e.g., about 0.2 $\mu m$ to about 2.0 $\mu m$, but other thicknesses may be used. For example, following the doping of the seed layer, about an additional 3.5 $\mu m$ of semiconductor material may be grown, but other epitaxial thicknesses may be used. With the growth of the epitaxial layer 30, the seed layer becomes a buried layer (not shown), which in the embodiment shown is a doped n-type buried layer. It is noted that the buried (seed) layer is optional. For example, in some cases, the semiconductor substrate 12 includes a floating epitaxial layer instead of the buried layer.

The structural, material, and other characteristics of the semiconductor substrate 12 may vary from the embodiment shown in FIG. 1. Additional, fewer, or alternative layers may be included in the semiconductor substrate 12. For example, any number of additional semiconductor and/or non-semiconductor layers may be included. The disclosed devices are thus not limited to, for instance, SOI or bulk substrates, or substrates including epitaxially grown layers, and instead may be supported by a wide variety of other types of semiconductor substrates.

Figure 2:
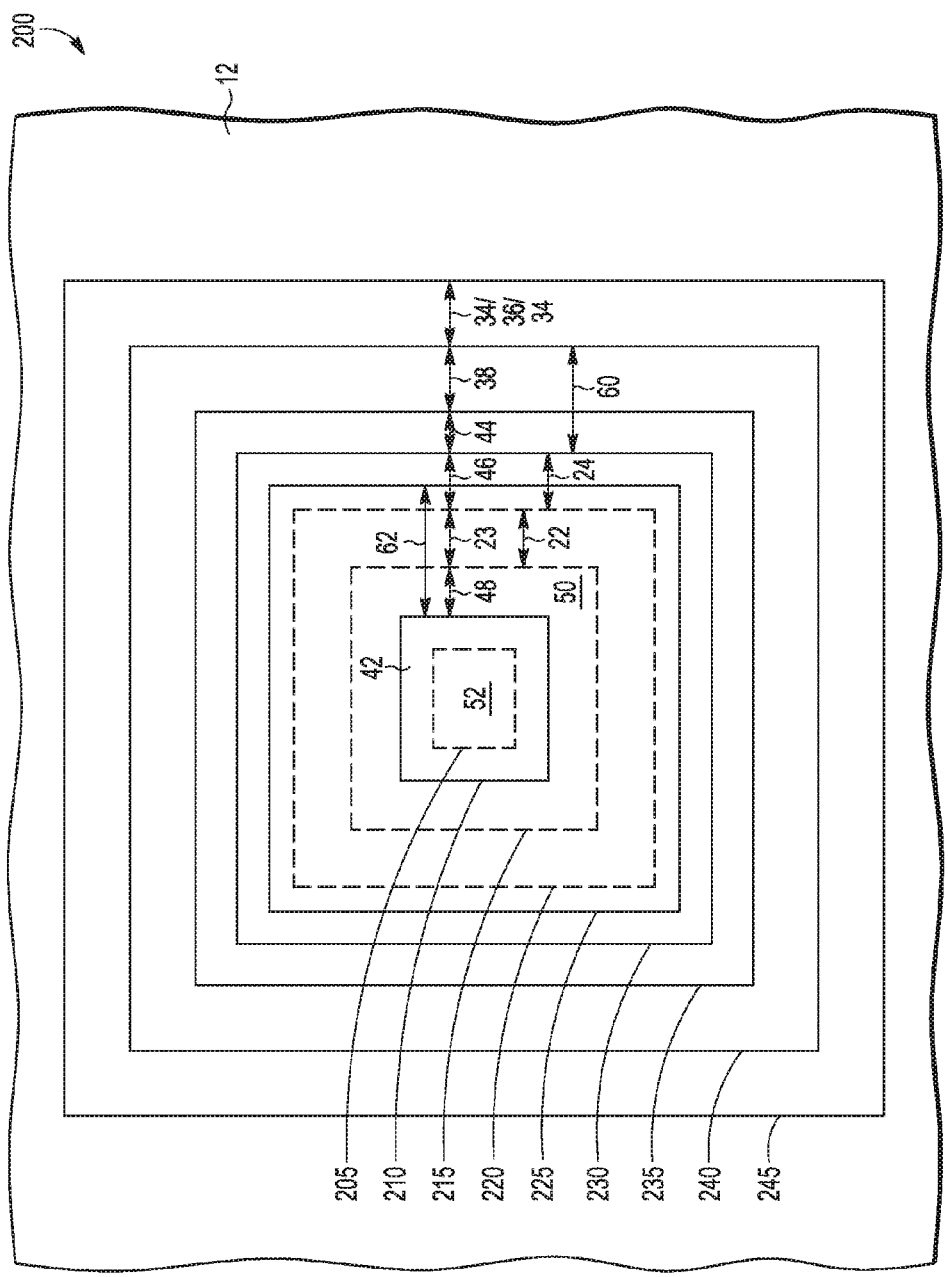
FIG. 2 illustrates a block diagram depicting a plan view of an example diode having multiple junctions in which the disclosure is implemented, according to some embodiments.

A device area 32 of diode 100 is depicted in FIG. 1. Device area 32 may be defined by one or more isolation trenches. In the embodiment shown, a single, ring-shaped isolation trench that laterally surrounds device area 32 and includes a pair of deep trench isolation (DTI) regions 34 laterally spaced from one another in the epitaxial layer(s) 30. The DTI regions 34 may reach the original substrate 26 as shown. The DTI region(s) 34 may include an insulating material, such as $SiO_2$. The DTI regions 34 may isolate the device area 32 from the surrounding substrate 12 by laterally surrounding device area 32 and extending downward to reach to at least the depth of the buried insulator layer 28 or other device isolating layer. In the embodiment shown, the buried insulator layer 28 extends laterally across, e.g., under, the device area 32 to act as a vertical barrier separating the device area 32 from the original substrate 26. The DTI regions 34 may also be ring-shaped. It is noted that an example of the ring shapes discussed herein is shown in the embodiment of FIG. 2.

The isolation trench(es) may include a substrate connection to bias the original substrate 26. In the embodiment shown in FIG. 1, the isolation trench includes a substrate tie 36 disposed between the DTI regions 34. The substrate tie 36 may be configured as an inner conductive trench, such as a doped polysilicon plug, that extends from a surface of substrate 12 through the buried insulator layer 28 to establish an electrical connection to the original substrate 26. The substrate tie 36 may also be ring-shaped. The DTI regions 34 and the substrate tie 36 may thus laterally and/or otherwise surround the device area 32.

The lateral extent of the device area 32 may also be defined by one or more additional trench isolation regions. In the embodiment shown, the device area 32 is further defined by a shallow trench isolation (STI) region 38 disposed at a surface 40 of the semiconductor substrate 12, where the surface 40 corresponds with an upper surface of the epitaxial layer 30. The STI region 38 may be ring-shaped. In the embodiment shown, the STI region 38 is disposed adjacent to an inner one of the DTI regions 34. The STI region 38 may be used to provide further separation between the substrate tie 36 and the active area 32 of the diode 100. In other embodiments, the device area 32 can be separated from other surrounding devices by the junction isolation, where DTI regions would be optional in such embodiments.

Diode 100 includes contact regions 42 and 44 laterally spaced from one another along the surface 40 of the semiconductor substrate 12. Diode 100 may be considered to be configured or arranged as a vertical diode. In the embodiments discussed herein, the contact region 42 is p-type and thus configured as an anode contact region. The contact region 44 is n-type and thus configured as a cathode contact region. In other embodiments, the conductivity types of the contact regions 42, 44 may be switched to provide a diode with a reverse polarity.

In the embodiment shown in FIG. 1, the anode contact region 42 corresponds with an inner electrode of the diode 100, while the cathode contact region 44 corresponds with an outer electrode of the diode 100. Anode contact region 42 may be laterally centered within the device area 32. The cathode contact region 44 may be ring-shaped to laterally surround the anode contact region 42. Cathode contact region 44 may be disposed laterally adjacent to STI region 38 (e.g., contiguous with or directly abutting STI region 38).

Diode 100 includes an isolation region 46 disposed at the surface 40 of the semiconductor substrate 12 between the anode and cathode contact regions 42, 44. Isolation region 46 is laterally spaced from the anode contact region 42. The isolation region 46 is used to electrically separate the anode contact region 42 (and other anode regions) and the cathode contact region 44 at the surface 40 of the semiconductor substrate 12. Such separation may lower the leakage current. The isolation region 46 may be configured as an STI region. The isolation region 46 may thus be configured similarly to the STI region 38, although at a different location. A lower boundary of the isolation region 46 may be deeper than the lower boundaries of the anode and cathode contact regions 42, 44. For example, the lower boundary of the isolation region 46 may be at a depth of about 0.2 to about 0.5 $\mu m$ from surface 40, but other depths may be used. The isolation region 46 may be a ring-shaped region that laterally surrounds the anode contact region 42.

In the embodiment shown in FIG. 1, the isolation region 46 is contiguous with (or adjacent to or directly abutting) the cathode contact region 44. In other embodiments, the isolation region 46 is spaced apart from the cathode contact region 44. For example, a lightly or moderately doped n-type region, such as a portion of an n-type well region (e.g., a portion of outer well region 60) in which the cathode contact region 44 is formed, may be disposed between the isolation region 46 and the cathode contact region 44. In other embodiments, the diode 100 does not include the STI region as the isolation region 46. Isolation between the anode contact region 42 and the cathode contact region 44 may be further provided by a silicide block 62 (described below), which may serve as a hard mask for the implantation procedures used to form the anode contact region 42 and the cathode contact region 44, as described below.

The anode contact region 42 is part of a composite anode region of the diode 100. In the embodiment shown in FIG. 1, the composite anode region further includes an intermediate anode region 48. The intermediate anode region 48 is disposed in the semiconductor substrate 12 between the anode contact region 42 and the cathode contact region 44. In the embodiment shown, intermediate anode region 48 is contiguous with (or adjacent to or directly abutting) anode contact region 42 and is electrically connected therewith. Intermediate anode region 48 may be otherwise electrically connected with anode contact region 42. The intermediate anode region 48 may be a ring-shaped region that laterally surrounds the anode contact region 42. In some embodiments, the lower boundary of the intermediate anode region 48 is shallower than the lower boundary of the anode contact region 42 in an embodiment. In other embodiments, the lower boundary of the intermediate anode region 48 is at the same depth or deeper than the lower boundary of the anode contract region 42. In some embodiments, intermediate anode region 48 may include one or more regions that are electrically connected with anode contact region 42. Inner well region 22 (further discussed below) extends between intermediate anode region 48 and isolation region 46 to form a portion 23 of inner well region 22. Portion 23 of inner well region 22 is adjacent to and contiguous to both the intermediate anode region 48 and the isolation region 46. In other words, the portion 23 (also referred to as a separation region 23) of inner well region 22 laterally separates intermediate anode region 48 from isolation region 46, and provides lateral distance between the composite anode region of the diode and the isolation region 46. As part of the composite anode region, the intermediate anode region 48 is p-type, but may be n-type in other embodiments in which the positions of the anode and cathode are switched.

Figure 10:
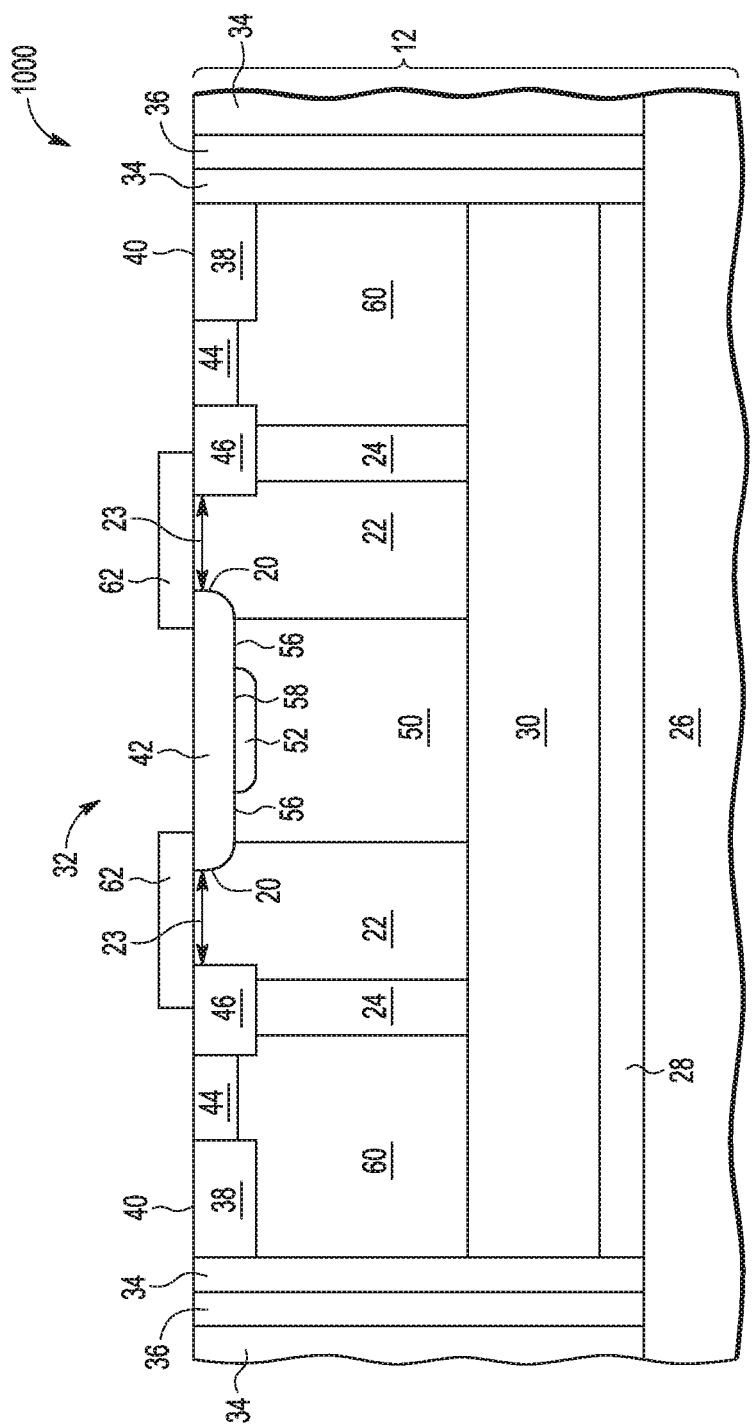
FIG. 10-17 illustrate block diagrams depicting cross-sectional views of additional example diodes in which the disclosure is implemented.

In other embodiments, the composite anode region does not include the intermediate anode region 48. Such an embodiment is illustrated in FIG. 10, where inner well region 22 extends between the anode contact region 42 and the isolation region 46 to form separation region 23, and separation region 23 of inner well region 22 is adjacent to and contiguous to both anode contact region 42 and isolation region 46, and laterally separates anode contact region 42 from isolation region 46. Such an embodiment produces a different junction structure, as further discussed below.

The cathode contact region 44 is part of a composite cathode region of diode 100 that further includes a buried region 50 disposed in the semiconductor substrate 12 under the anode contact region 42. Buried region 50 is laterally centered under the anode contact region 42. Buried region 50 may also be referred to as a well region, such as a buried well region or a centered well region. In the embodiment shown in FIG. 1, buried region 50 is disposed under the anode contact region 42 and under at least a portion of the intermediate anode region 48. The anode contact region 42 and intermediate anode region 48 may be disposed within or on the buried region 50. The cathode contact region 44 and the buried region 50 are electrically connected with one another. For example, the composite cathode region includes one or more further regions (e.g., inner well region 22, middle well region 24, and outer well region 60) that electrically couple the cathode contact region 44 and the buried region 50. The buried region 50 is configured as a well laterally centered under anode contact region 42 within the device area 32. In the embodiments discussed herein, the buried region 50 is an n-type well since it is part of the composite cathode region, but may be p-type in other embodiments in which the positions of the anode and cathode are switched.

In the embodiment shown in FIG. 1, the composite cathode region of the diode 100 includes a further buried region 52, also referred to simply as buried region 52. The buried region 52 may be disposed in the semiconductor substrate 12 above or on the buried region 50. The buried region 52 is laterally centered within the buried region 50, or otherwise disposed within (e.g., interior to) the lateral extent of the buried region 50. The buried region 52 is also laterally centered within the anode contact region 42. As shown in FIG. 1, buried region 52 is disposed under a portion of the anode contact region 42 (e.g., buried region 52 laterally extends along a portion of the entire lateral width of the anode contact region 42). The buried region 52 is vertically positioned between the anode contact region 42 and the buried region 50, where the buried region 52 is vertically adjacent to both the anode contact region 42 and buried region 50. As also shown in FIG. 1, the buried region 52 is spaced from (i.e., not directly abutting) the intermediate anode region 48. The buried region 52 is electrically connected to the cathode contact region 44 at least partially via the buried region 50. As part of the composite cathode region, buried region 52 is n-type, but may be p-type in other embodiments in which the positions of the anode and cathode are switched.

Figure 11:
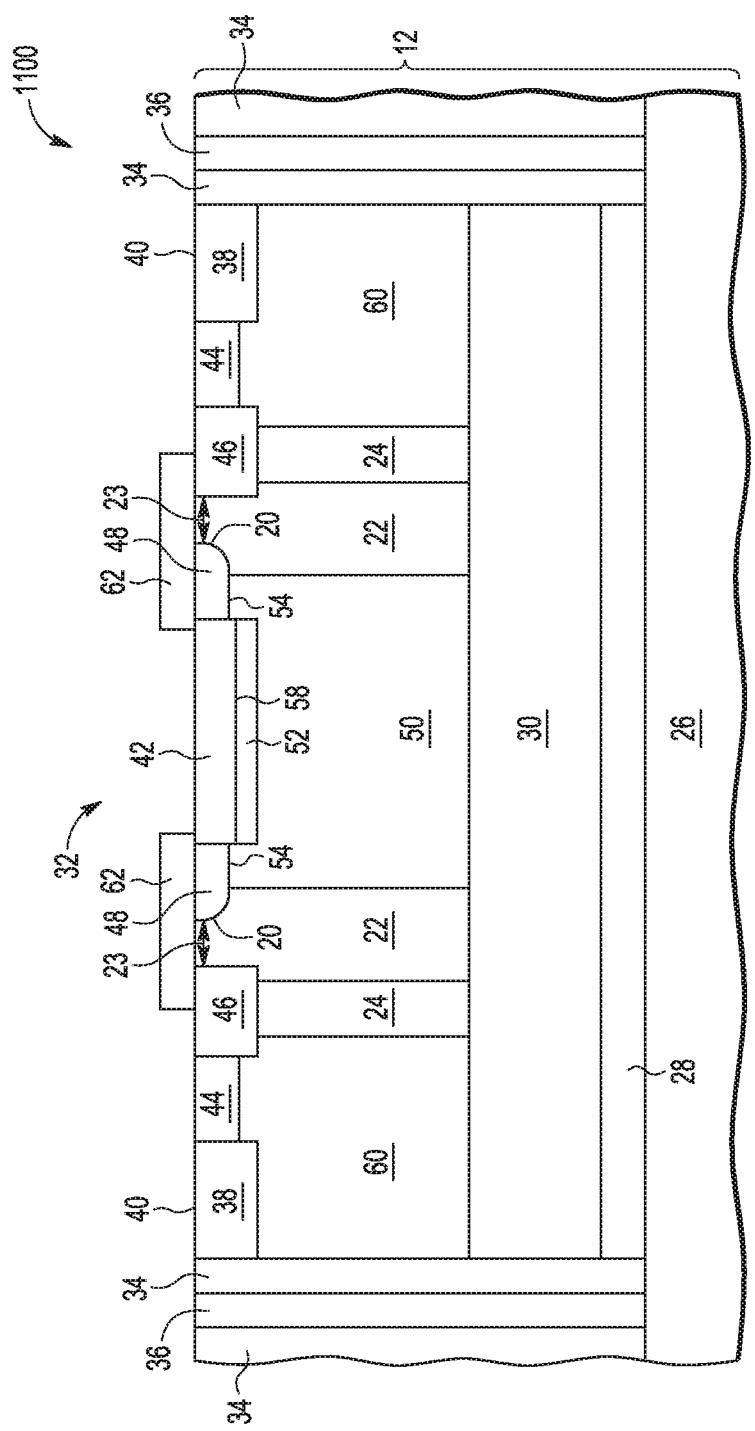
Figure 12:
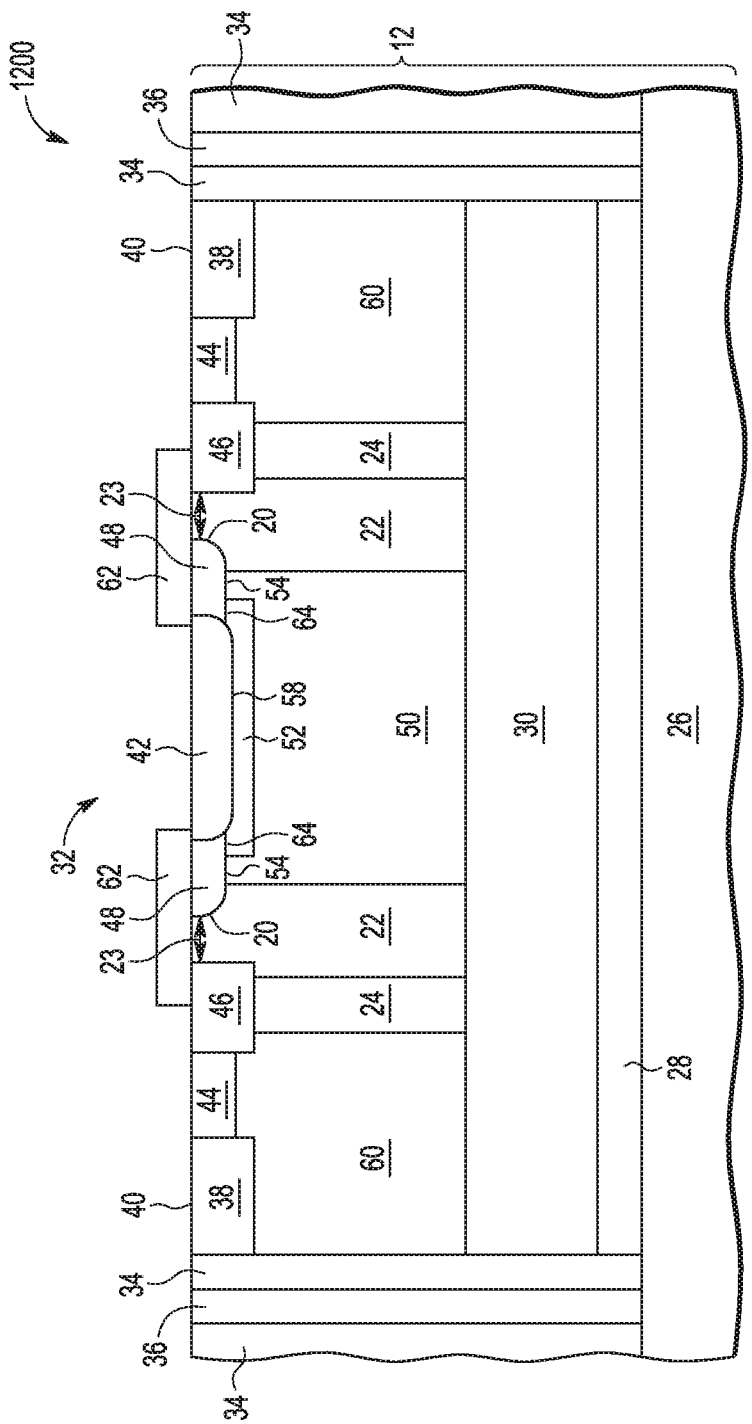

It is noted that the lateral extent of the further buried region 52 may vary from the embodiment shown in FIG. 1, where further buried region 52 laterally extends along a portion of the entire lateral width of anode contact region 42. In other embodiments, the buried region 52 is disposed under the entire anode contact region 42 (e.g., laterally extends along the entire lateral width of anode contact region 42), as shown in FIG. 11. In other embodiments the buried region 52 is disposed under the entire anode contact region 42 and under a portion of intermediate anode region 48 (e.g., laterally extends along the entire lateral width of anode contact region 42 and a portion of the entire lateral width of intermediate anode region 48), as shown in FIG. 12. Such embodiments each produce different junction structures, as further discussed below.

Figure 13:
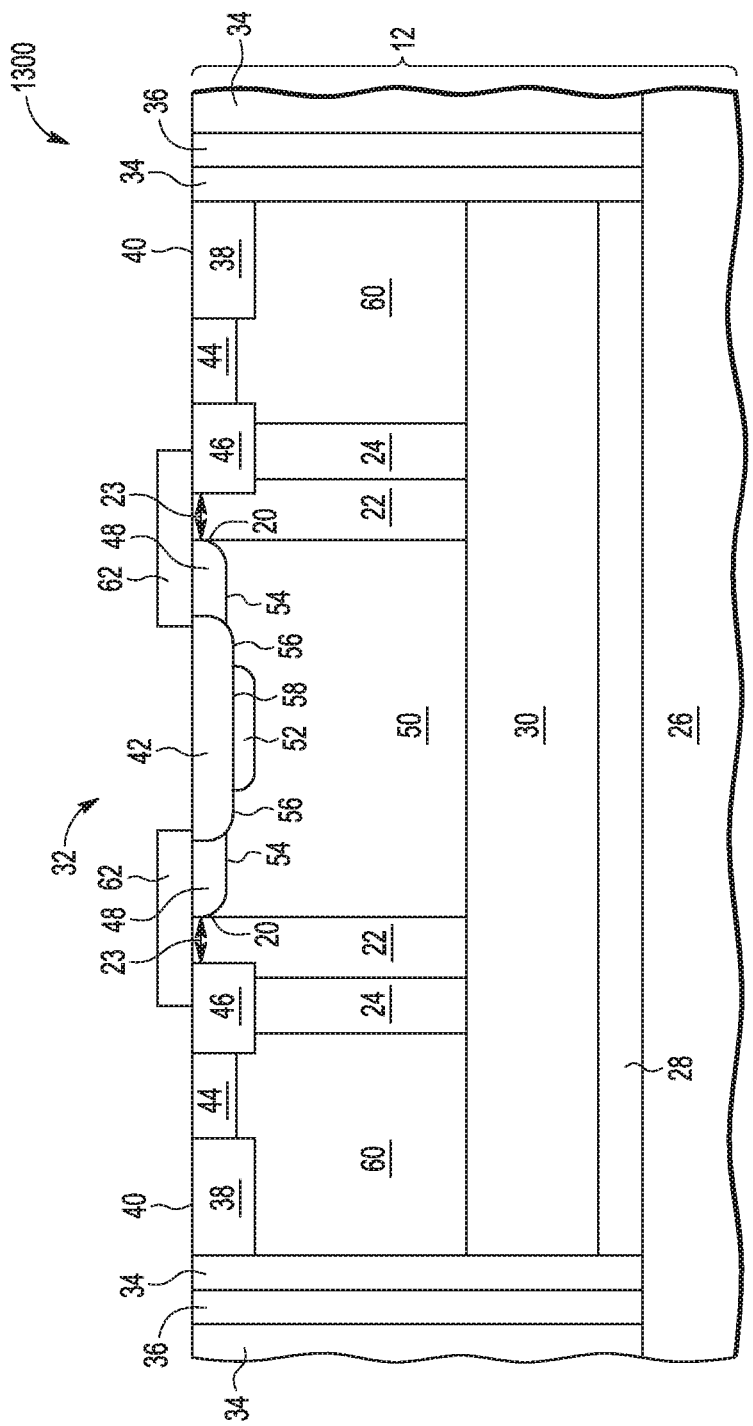
Figure 14:
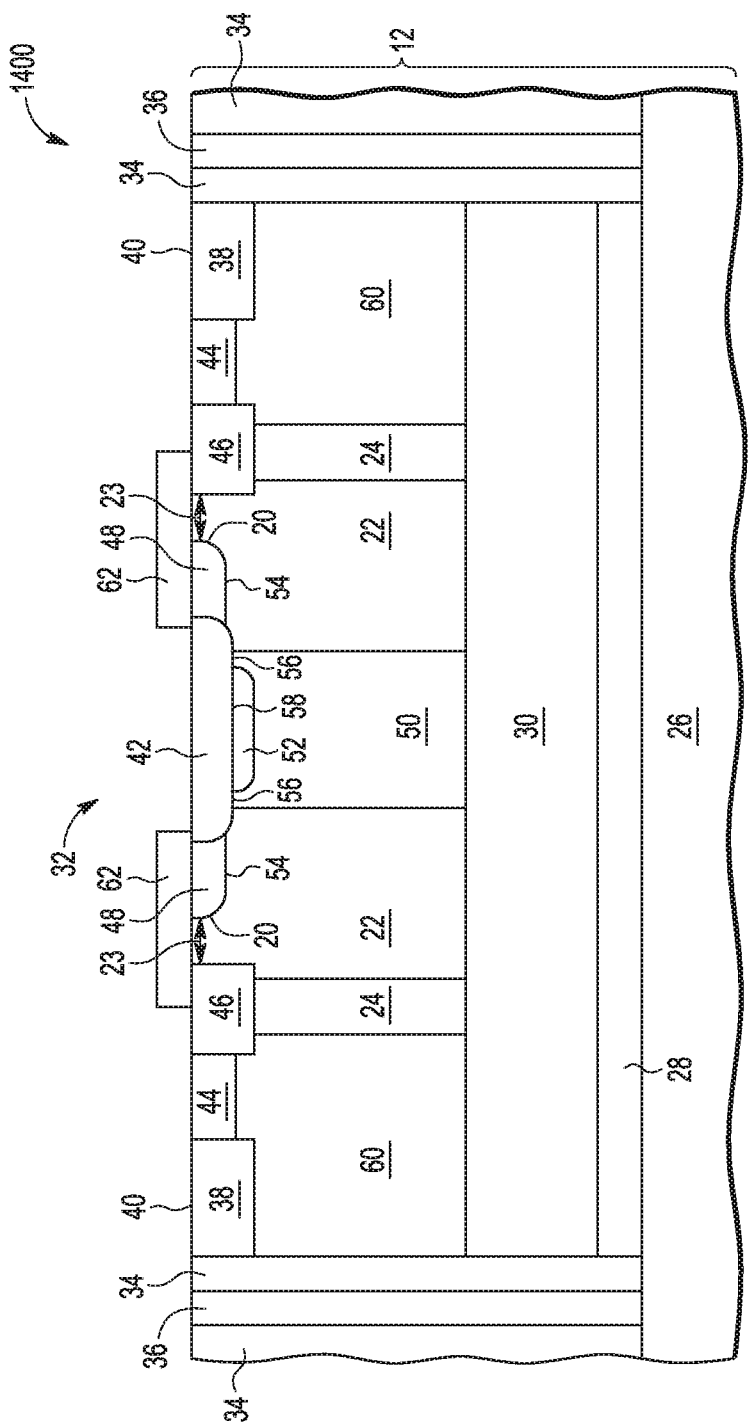
Figure 15:
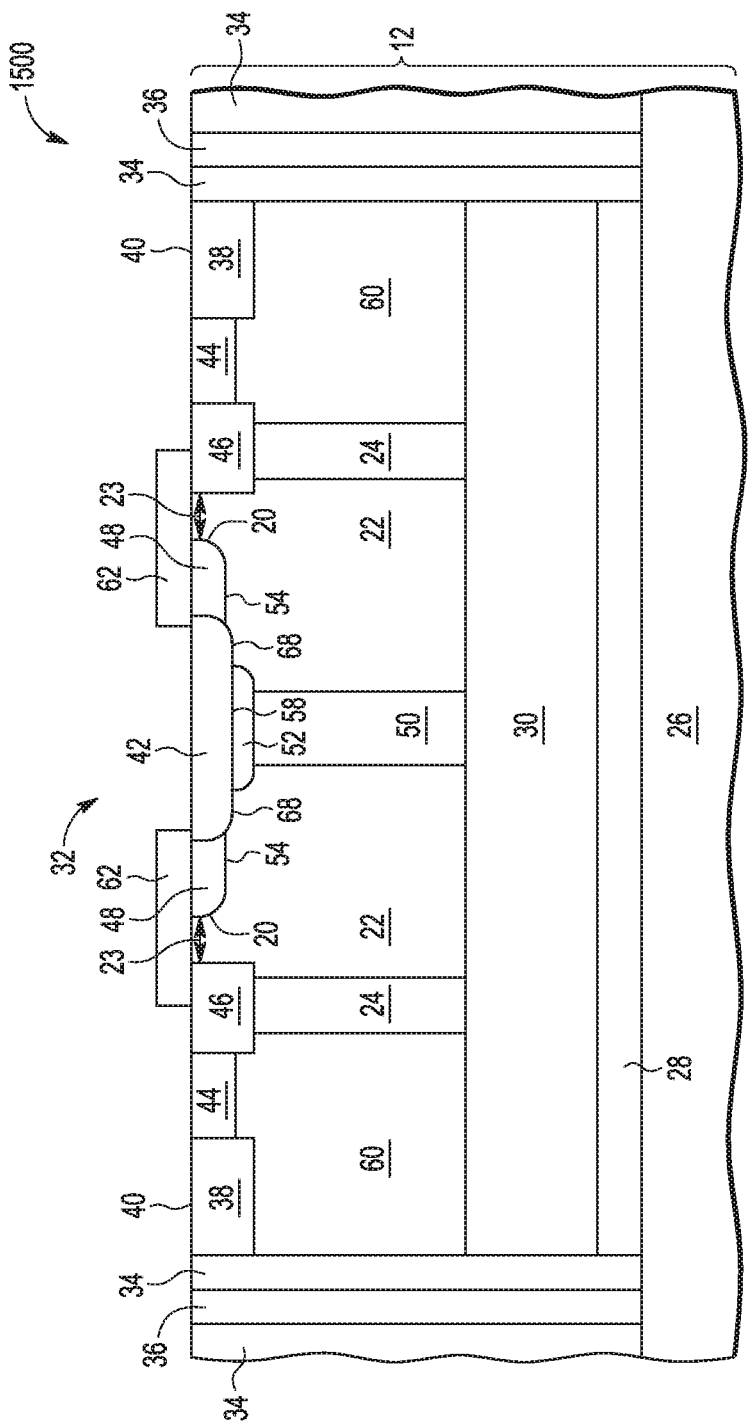

It is also noted that the lateral extent of the buried region 50 may vary from the embodiment shown in FIG. 1, where buried region 50 laterally extends along the entire lateral width of anode contact region 42 and laterally extends along a portion of the lateral width of intermediate anode region 48. In other embodiments, the buried region 50 laterally extends under the entire anode contact region 42 and the entire intermediate anode region 48 (e.g., laterally extends along the entire lateral widths of anode contact region 42 and intermediate anode region 48), as shown in FIG. 13. In other embodiments, the buried region 50 is disposed only under the anode contact region 42 (e.g., laterally extends along the entire lateral width or a portion of the entire lateral width of anode contact region 42), as shown in FIG. 14. In other embodiments, the buried region 50 is only partially disposed under anode contact region 42, such as being disposed only under the further buried region 52 (e.g., laterally extends along the entire lateral width or a portion of the entire lateral width of further buried region 52), as shown in FIG. 15. The embodiments illustrated in FIGS. 13-15 may also be combined with the embodiments illustrated in FIGS. 10-12, such as the further buried region 52 being disposed under the entire anode contact region 42 similar to FIG. 11 and buried region 50 being disposed under the entire or a portion of the entire anode contact region 42 similar to FIG. 14. Such embodiments each produce a different junction structure, as further discussed below.

In the embodiment shown in FIG. 1, the composite cathode region of the diode 100 also includes inner well or buried region 22 that is disposed adjacent to buried region 50. Inner well region 22 is configured as a lightly doped n-type well region disposed in the semiconductor substrate 12, which may be counter-doped to achieve lower dopant concentration of the inner well region 22. Inner well region 22 is electrically connected with the cathode contact region 44. Inner well region 22 may be a ring-shaped region that laterally surrounds buried region 50. Inner well region 22 is also disposed in the semiconductor substrate 12 under the silicide block 62 (discussed below). As part of the composite cathode region, inner well region 22 is n-type as shown, but may be p-type in other embodiments in which the positions of the anode and cathode are switched.

The lateral extent of the inner well region 22 may vary from the embodiment shown in FIG. 1, where inner well region 22 laterally extends under a portion of intermediate anode region 48 and under a portion of isolation region 46. In other embodiments, the portion of intermediate anode region 48 under which the inner well region 22 laterally extends is smaller (such as the embodiment shown in FIG. 13) or larger (such as the embodiment shown in FIG. 14). In other embodiments, the portion of isolation region 46 under which the inner well region 22 laterally extends may be similarly smaller or larger. In other embodiments, the junction of inner well region 22 and buried region 50 sits below the anode contact region 42 (and not necessarily at the edge of further buried region 52), similar to the embodiment shown in FIG. 15. In other embodiments, intermediate anode region 48 is absent from the composite anode region, where inner well region 22 laterally extends between the edges of the anode contact region 42 and isolation region 46, with the portion 23 of inner well region 22 remaining adjacent to and contiguous to both regions 42 and 46, as shown in FIG. 10. In other embodiments, the portion of anode contact region 42 under which inner well region 22 laterally extends may be smaller or larger. In other embodiments, the composite cathode region does not include inner well region 22, as discussed below in connection with FIG. 17. Such embodiments produce different junction structures, as further discussed below.

In the embodiment illustrated in FIG. 1, the composite cathode region of the diode 100 also includes a middle well or buried region 24 that is disposed in the semiconductor substrate 12 adjacent to the inner well region 22 and under isolation region 46. Middle well region 24 is configured as a moderately to heavily doped n-type well region, in order to lower the series resistance of diode 100. Middle well region 24 is electrically connected with the cathode contact region 44. The middle well region 24 may be a ring-shaped region that laterally surrounds inner well region 22. As part of the composite cathode region, middle well region 24 is n-type as shown, but may be p-type in other embodiments in which the positions of the anode and cathode are switched.

Figure 16:
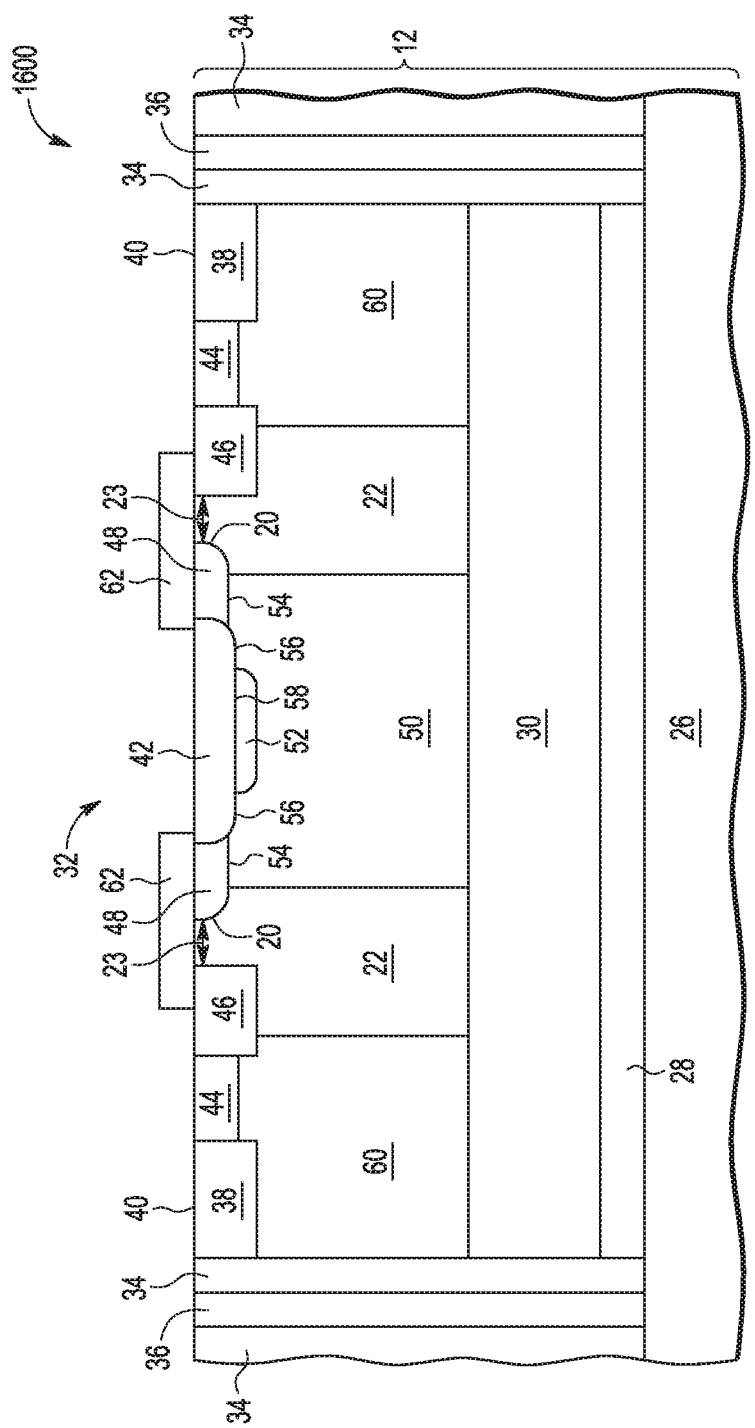
Figure 17:
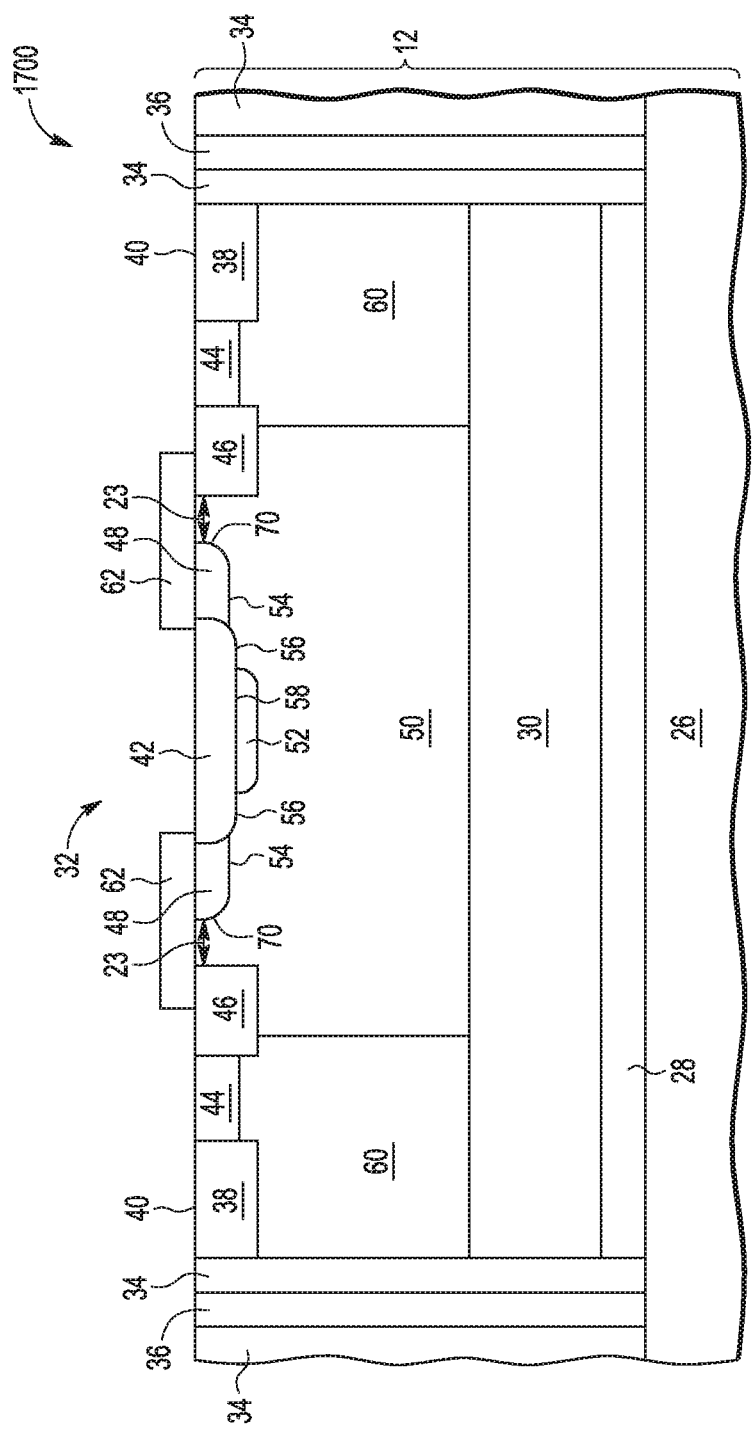

The lateral extent of middle well region 24 may vary from the embodiment shown in FIG. 1, which is disposed under a portion of isolation region 46 (e.g., laterally extends along a portion of the entire lateral width of isolation region 46). In other embodiments, middle well region 24 is disposed under the entire isolation region 46 (e.g., laterally extends along the entire lateral width of isolation region 46, where the edges of isolation region 46 and middle well region 24 align). In other embodiments, the composite cathode region does not include middle well region 24 and does include inner well region 22. Such an embodiment is illustrated in FIG. 16, where inner well region 22 laterally extends under at least a portion of isolation region 46, up to and including laterally extending under the entire isolation region 46. In other embodiments, the composite cathode region does not include middle well region 24 and does not include inner well region 22. Such an embodiment is illustrated in FIG. 17, where buried region 50 laterally extends under anode contact region 42 and under intermediate anode region 48.

In other embodiments where the composite cathode region does not include middle well region 24 and does include inner well region 22, inner well region 22 laterally extends both under at least a portion of anode contact region 42 (similar to that shown in FIG. 15) and under at least a portion of isolation region 46 (similar to that shown in FIG. 16). In other embodiments, the composite cathode region does include middle well region 24 and does not include inner well region 22, the middle well region 24 is disposed within a region similar to that of region 22 illustrated in FIG. 16. (e.g., region 22 of FIG. 16 would be replaced with region 24). Such embodiments produce different junction structures, as further discussed below.

In the embodiment illustrated in FIG. 1, the composite cathode region of the diode 100 may also include an outer buried or well region 60 that is disposed in the semiconductor substrate 12 adjacent to the middle well region. Outer well region 60 may also be disposed under cathode contact region 44 and STI region 38, adjacent to inner DTI region 34. Outer well region 60 is configured as a moderately to heavily doped n-type well region disposed in the semiconductor substrate 12. It is desirable to have a lower dopant concentration in the lateral junction 20 underneath the silicide block, and a higher dopant concentration in all other cathode well regions in order to lower the series resistance of the diode 100. The cathode contact region 44 may be disposed within or on the outer well region 60. Outer well region 60 is electrically connected to the cathode contact region 44. The outer well region 60 may be a ring-shaped region that laterally surrounds the middle well region 24. The lateral extent of outer well region 60 may vary from the embodiment shown. In the embodiment shown, outer well region 60 laterally extends under the entire cathode contact region 44, under the entire STI region 38, and under a portion of the isolation region 46. In other embodiments, outer well region 60 may laterally extend under a larger or smaller portion of the isolation region 46. As part of the composite cathode region, buried region 60 is n-type as shown, but may be p-type in other embodiments in which the positions of the anode and cathode are switched.

The diode 100 includes a silicide block 62 supported by the semiconductor substrate 12. In the embodiment shown, the silicide block 62 is disposed at the surface 40 over lateral junction 20 between the intermediate anode region 48 and inner well region 22. The silicide block 62 may prevent silicide from forming along the intermediate anode region 48, such as along the lateral junction 20. For example, without the silicide block 62, undesirable levels of leakage current could result, since the silicide is close enough to the underlying outer vertical junction 54 that the depletion region reaches the silicide. The silicide block 62 extends over the intermediate anode region 48, over inner well region 22, and at least part of the isolation region 46 to help avoid such leakage current scenarios. The silicide block 62 may be a ring-shaped structure that laterally surrounds the anode contact region 42. The silicide block 62 may also serve as a mask for an implantation procedure implemented to form the anode contact region 42, as described below in connection with FIG. 9.

Junctions

The diode 100 includes multiple vertical junctions defined by the composite anode and cathode regions. The multiple vertical junctions may be disposed in parallel between the anode and cathode terminals, e.g., metal or other conductive electrodes, electrically connected to the anode and cathode contact regions 42, 44, respectively. In the embodiment shown in FIG. 1, an outer vertical junction 54 is defined at an interface between intermediate anode region 48 and buried region 50, a middle vertical junction 56 is defined at an interface between anode contact region 42 and buried region 50, and an inner vertical junction 58 is defined at an interface between anode contact region 42 and buried region 52.

In the embodiment shown in FIG. 1, the buried region 50 extends laterally across at least a portion of the intermediate anode region 48 to establish the outer vertical junction 54, and across at least a portion of the anode contact region 42 to establish the middle vertical junctions 56. The buried region 52 is disposed adjacent to the anode contact region 42 to define the inner vertical junction 58. The buried region 52 is laterally spaced from the intermediate anode region 48 to dispose the middle vertical junction 56 between the inner vertical junction 58 and outer vertical junction 54. The inner vertical junction 58 is also laterally farthest from the isolation region 46. Charge carriers resulting from breakdown of the inner vertical junction 58 may thus be less likely to become trapped in the isolation region 46. Breakdown voltages of the junctions are further discussed below.

Also in the embodiment shown in FIG. 1, a lateral junction 20 is defined at an interface between a lateral outer edge of the intermediate anode region 48 and the separation region (or portion) 23 of the inner well region 22. In embodiments where the intermediate region 48 includes one or more regions, one of the one or more regions is adjacent to the separation region and has the lateral outer edge that forms the lateral junction 20 with the separation region 23. The portion 23 of inner well region 22 may be a ring-shaped region that laterally surrounds intermediate anode region 48, and the isolation region 46 may also be a ring-shaped region that laterally surrounds the portion 23 of inner well region 22. Lateral junction 20 is disposed under the silicide block 62. The lateral width of the portion 23 may be smaller than or equal to the lateral width of the (underlying) inner well region 22. In some embodiments, lateral junction 20 is disposed within (e.g., interior to) the lateral extent of inner well region 22. In other embodiments, lateral junction 20 is disposed at an inner edge of inner well region 22, where the inner edge of the portion 23 aligns with the inner edge of the inner well region 22.

Different junction structures are formed in other embodiments, such as those embodiments shown in FIGS. 10-17, which include junctions similar to those discussed in connection with FIG. 1 unless otherwise noted. Since the embodiment of FIG. 10 does not include the intermediate anode region 48, the embodiment also does not include outer vertical junction 54 (e.g., the interface between intermediate anode region 48 and buried region 50 is absent). The embodiment of FIG. 10 also includes the lateral junction 20 formed at an interface between a lateral outer edge of anode contact region 42 and inner well region 22, where the portion 23 of inner well region 22 laterally surrounds anode contact region 42.

The embodiment of FIG. 11 includes further buried layer 52 extending along the entire lateral width of anode contact region 42, forming inner vertical junction 58 along the entire interface between anode contact region 42 and further buried layer 52. As such, buried layer 50 does not share an interface with anode contact region 42, and the embodiment of FIG. 11 does not include middle vertical junction 56.

The embodiment of FIG. 12 includes further buried layer 52 extending along the entire lateral width of anode contact region 42 and along at least a portion of intermediate anode region 48, forming inner vertical junction 58 along the entire interface between anode contact region 48 and further buried layer 52. Since buried layer 50 does not share an interface with anode contact region 42, the embodiment of FIG. 12 does not include middle vertical junction 56. Also, outer vertical junction 54 formed along the interface between intermediate anode region 48 and buried layer 50 has a shortened lateral width, as compared with the embodiment of FIG. 1. Additionally, a new middle vertical junction 64 is formed at the interface between intermediate anode region 48 and further buried layer 52, which may act in a manner similar to middle vertical junction 56 of FIG. 1.

The embodiments of FIGS. 13 and 16 include the junctions similar to those discussed in connection with FIG. 1. The embodiment of FIG. 14 includes outer vertical junction 54 formed at an interface between intermediate anode region 48 and inner well region 22. The embodiment of FIG. 15 includes outer vertical junction 54 formed at an interface between intermediate anode region 48 and inner well region 22, but does not include middle vertical junction 56. The embodiment of FIG. 15 instead includes a middle vertical junction 68 formed at the interface between anode contact region 42 and inner well region 22. The embodiment of FIG. 17 includes a lateral junction 70 formed at the interface between a lateral outer edge of intermediate anode region 48 and the buried layer 50. The embodiment of FIG. 17 also includes buried layer 50 extending between intermediate anode region 48 and isolation region 46 to form a separation region 23 of buried layer 50, where separation region 23 of buried layer 50 is adjacent to and contiguous to both intermediate anode region 48 and isolation region 46. In other words, separation region 23 laterally separates intermediate anode region 48 and isolation region 46.

The above-described composite cathode and anode regions may be configured to establish a target or desired breakdown voltage for the diode 100. The target breakdown voltage is achieved through breakdown of an inner junction (e.g., the inner vertical junction 58 shown in FIG. 1) spaced from STI or other isolation regions to improve operational stability. In some embodiments, the diode 100 is configured as a low voltage diode. The breakdown voltage of the diode 100 may be about 7 Volts, although other voltage levels may be provided. The other junctions of the diode 100 in parallel with the inner vertical junction that are closer to the isolation region(s) may have any breakdown voltage higher than the target breakdown voltage level.

The depth of the vertical junctions below the surface 40 of the substrate 12 may vary from the embodiment shown in FIG. 1, as diode stability may be improved as long as the relative breakdown voltages of the junctions are arranged as described herein. As shown in the embodiment of FIG. 1, the outer vertical junction 54 is disposed at a shallower depth in the semiconductor substrate 12 than the middle vertical junction 56. The position of the outer vertical junction 54 may be controlled by the dopant implantation procedure used to form the intermediate anode region 48. The inner vertical junction 58 and the middle vertical junction 56 may be disposed at the same depth as shown in FIG. 1. The outer vertical junction 54 may thus also be disposed at a shallower depth than the inner vertical junction 58. The depth of the middle and inner vertical junctions 56, 58 may be mainly determined by the dopant implantation procedure used to form the anode contact region 42. The depth of inner vertical junction 58 may also be determined by the dopant implantation procedure to form the further buried layer 52.

The multiple vertical junctions and lateral junction have different breakdown voltage levels in some embodiments. The breakdown voltage levels differ to improve the operational stability of the diode 100. Generally, the regions of the diode 100 are doped and otherwise configured such that the breakdown voltage levels of the vertical junctions increase as the distance between the junction and the isolation region 46 decreases. In the embodiment of FIG. 1, the middle vertical junction 56 has a lower breakdown voltage level than the outer junction 54, and the inner vertical junction 58 has a lower breakdown voltage level than the outer and middle vertical junctions 54, 56. As the vertical junction farthest from the isolation region 46, the inner vertical junction 58 has the lowest breakdown voltage level. For example, if breakdown voltage occurs at about 7 volts at the inner vertical junction 58, then charge carriers are not flowing through the other vertical junctions 54, 56 closer to the isolation region 46 until the voltage at the cathode contact region 44 exceeds the higher breakdown voltage levels thereof. In some embodiments, the breakdown voltage of the middle vertical junction 56 is in a range of 5 to 100 percent higher than the breakdown voltage for the inner vertical junction 58, and the breakdown voltage of the outer vertical junction 54 is in a range of about 5 to 300 percent higher than the breakdown voltage of the middle vertical junction 56, although the breakdown voltage differences may be greater or less than the above-given ranges.

By disposing the portion 23 of inner well region 22 between intermediate anode region 48 and isolation region 46 (which establishes lateral junction 20 at an interface between the portion 23 and the intermediate anode region 48), the outer edge of intermediate anode region 48 is pulled away from isolation region 46, which also pulls the active pn junctions of the composite anode region (e.g., vertical junctions 58, 56, 54 and lateral junction 20) away from isolation region 46. The separation of the active pn junctions from isolation region 46 reduces interaction between the heavy implants of the composite anode region with the inner edge of isolation region 46, which may also reduce generation of sub-surface defects or other damage at the inner edge of isolation region 46 due to such interaction that may result in leakage current. Configuring the inner well region 22 to be a lightly doped region increases the breakdown voltage at lateral junction 20. Accordingly, the presence of inner well region 22 in diode 100 results in improved stability of diode 100 upon exposure to greater electrical stress.

The lateral extent of the outer well region 60 may be configured to lower the series resistance of the diode 100 without affecting the breakdown voltage levels of the vertical junctions 54, 56, 58, and lateral junction 20. To avoid affecting the breakdown voltage levels, the outer well region 60 may be positioned outward of the intermediate anode region 48. In the embodiment shown, the outer well region 60 extends under the isolation region 46. An inner edge of the ring shape of the outer well region 60 is positioned at the isolation region 46. The outer well region 60 is also spaced from each constituent region of the composite anode region by inner well region 22 and middle well region 24, which eliminates outer well region 60's effect on the breakdown voltage levels of the junctions 54, 56, 58, and 20. The dopant concentration level of the outer well region 60 may be set to a level that lowers, i.e., improves, the series resistance of the diode 100 without concern that the breakdown voltage levels would be affected.

Dopant Implantation

One or more of the above-described regions may be formed via a respective implantation procedure, where each implantation procedure includes one or more implants of dopant ions having some energy level being implanted at some implant angle to achieve some dopant concentration in a given region of the substrate. For example, the buried region 50 of the composite cathode region may be formed via a combination of implants for logic and power FET devices. The dopant ions, dopant concentration, energy levels, implant angle, and other characteristics of the implants may vary in accordance with the parameters established by the FET device design(s).

Example implants for forming the above-described regions are provided in the following listing, where the implants are listed with approximate peak ion implant energies.

|  | Ion | Ion Energy | Angle |
|---|---|---|---|
| n-type low voltage well implant 730: | As | 450 KeV | 0° |
| n-type low voltage well implant 732: | P | 1.0 MeV | 0° |
| n-type low voltage well implant 734: | Sb | 135 KeV | 0° |
| n-type high voltage well implant 742: | P | 1500 KeV | 1° |
| n-type compensation implant 740: | P | 720 KeV | 1° |
| n-type high voltage body implant 736: | P | 2000 KeV | 1° |
| p-type high voltage well implant 738: | B | 350 KeV | 4° |
| p-type LDD (PLDD) implant 744: | B | 5 KeV | 0° |
| n-type LDD (NLDD) implant 746: | P | 35 KeV | 0° |

Different, fewer, or additional dopant ions may be used for one or more of the above-described regions and/or implants. For example, one of the three implantation procedures for the low voltage n-type well region may be omitted. The implantation procedures described herein may use the same or different dopant ions.

The dopant concentrations, thicknesses, and other characteristics of the above-described semiconductor regions in the semiconductor substrate 12 may vary. For example, the dopant concentration of the original substrate 26 may vary considerably. For the embodiment shown in FIG. 1, the above-referenced semiconductor regions may have the following approximate concentrations and thicknesses (which may correspond with the depths from surface 40):

|  | Concentration | Thickness |
|---|---|---|
| substrate 26: | $2 \times 10^{15}/cm^3$ | not applicable |
| buried layer 30: | $8 \times 10^{18}/cm^3$ | 1.5 µm |
| contact 42: | $2 \times 10^{21}/cm^3$ | 0.2 µm |
| contact 44: | $2 \times 10^{21}/cm^3$ | 0.2 µm |
| region 48: | $2 \times 10^{18}/cm^3$ | 0.15 µm |
| buried region 50: | $6 \times 10^{17}/cm^3$ | 3.5 µm |
| buried region 52: | $8 \times 10^{17}/cm^3$ | 0.1 µm |
| inner well region 22: | $2 \times 10^{16}/cm^3$ | 3.5 µm |
| middle well region 24: | $1 \times 10^{17}/cm^3$ | 3.5 µm |
| outer well region 60: | $1 \times 10^{18}/cm^3$ | 3.5 µm |

In some embodiments, the above-described regions are formed using existing dopant implantation procedures available for fabricating one or more regions of an FET device. For example, the existing implantation procedures may be directed to fabricating a high voltage (or power) FET device (e.g., an LDMOS device), a high or low voltage analog FET device, or a low voltage (or logic) FET device. The dopant concentration, ion energy, implant angle, and/or other characteristics of the implants may thus vary in accordance with the parameters established by the FET device design(s). In other embodiments, one or more implantation masks may be used that do not correspond with an existing mask or implant. The disclosed devices are thus not limited to designs in which each feature is fabricated via an implant used to fabricate a FET device. The disclosed devices are also not limited to designs in which the dopant for each region or section thereof is provided via an implantation procedure.

As described below in connection with FIGS. 7-9, a number of implantation procedures (or combination of implants) are used to form the various regions and structures of the semiconductor substrate 12, which may overlap. For example, the implantation procedures used to form the buried regions 50 and 52 may overlap a common surface of semiconductor substrate 12 (e.g., both sets of implantation procedures are targeted to implant an overlapping area of regions 50 and 52). The buried region 52 may thus be considered to be formed within or on the well of the buried region 50. The dopant concentration level of the buried region 52 may thus correspond with the sum of the respective dopant concentrations provided by the implantation procedures used to form the buried regions 50 and 52. As another example, some of the implantation procedures used to form middle well region 24 and outer well region 60 overlap, while some of the implantation procedures to form inner well region 22 and middle well region 24 overlap. Additionally, a lower edge of each of buried region 50, inner well region 22, middle well region 24, and outer well region 60 are shown to be at a same depth (e.g., at a top edge of epitaxial layer 30) as measured from the surface 40 of the semiconductor substrate 12 in the embodiment shown in FIG. 1, although the depths of such regions may be different in other embodiments.

The constituent regions of the composite anode and cathode regions have dopant concentration levels to establish target or desired breakdown voltage levels for the multiple junctions. On the anode side, the intermediate anode region 48 has a lower dopant concentration level than the anode contact region 42. In examples in which the intermediate anode region 48 is formed via a FET terminal extension implantation procedure, such as a lightly doped drain (LDD) implantation procedure, the difference in the anode dopant concentration levels may be greater than one or two orders of magnitude. On the cathode side, the buried region 52 may have a higher dopant concentration level than the buried region 50. The difference in the cathode dopant concentration levels may be less than two orders of magnitude.

The implants utilized to create the various regions of the embodiment illustrated in FIG. 1 include multiple n-type low voltage well implants 730, 732, 734, as well as an n-type high voltage well implant 742, and an n-type high voltage compensation (or comp) implant 740 directed to compensating for the p-type doping of the epitaxial layer 30 for use in an accumulation or drift region of a power FET device. The dopant distributions resulting from the implants 730, 732, 734, 740, 742 overlap to form the buried region 50.

The respective dopant concentration levels of the implants 730, 732, 734, 740, and 742 may vary considerably from one another in forming the buried region 50. For example, the n-type comp implant 740 may be configured to achieve low to moderate dopant concentration levels. In some embodiments, the n-type comp implant 740 may be considerably lighter, e.g., about an order of magnitude or more, lower than one of the other implants (e.g., the well implant 732) used to form the buried region 50. The n-type comp implant 740 may be useful for compensating for the p-type doping of the epitaxial layer 30 without reaching heavy n-type dopant concentration levels. In one example, the n-type comp implant 740 is configured to support a dopant concentration level of about $5 \times 10^{15}/cm^3$ to about $1 \times 10^{17}/cm^3$. The n-type comp implant 740 may also have an energy level configured for a shallow depth, which may be useful in forming an accumulation and/or drift region of an LDMOS device.

The inner well region 22 of the composite cathode region may be formed in part by a p-type high voltage well implant 738 that may be useful for counter-doping inner well region 22 to achieve low dopant concentration levels. In some embodiments, the inner well region 22 may be formed by a combination of the p-type high voltage well implant 738, the n-type comp implant 740, and the n-type high voltage well implant 742.

The outer well region 60 of the composite cathode region may be formed in part by an n-type high voltage body implant 736, which may be directed to forming a body region of a p-type power FET device. In some embodiments, outer well region 60 is formed by a combination of the n-type high voltage body implant 736, the n-type comp implant 740, and the n-type high voltage well implant 742.

In some embodiments, the middle well region 24 of the composite cathode region may be formed by a combination of the n-type high voltage body implant 736, p-type high voltage well implant 738, n-type comp implant 740, and n-type high voltage well implant 742.

The implants used to form the anode and cathode contact regions described herein may be configured to form source/drain regions of logic and/or power FET devices. The dopant concentration levels achieved by the source/drain implants may be sufficient to form ohmic contacts. By contrast, some implants may not be heavy enough to form ohmic contacts. For example, a FET terminal extension implant is used to form the intermediate anode region 48 by being configured to form a moderately or heavily doped region, such as a lightly doped drain (LDD) region of a power FET device. For the embodiment illustrated in FIG. 1, the implant 744 is a p-type LDD (PLDD) implant. The PLDD implant 744 provides a lower dopant concentration level and may be used to establish a higher breakdown voltage level for the outer vertical junction 54 and the lateral junction 20 (i.e., the vertical and lateral junctions closest to the isolation region 46). In some embodiments, the PLDD implant 744 may have a dopant concentration profile shallower than the other implants.

An n-type LDD (NLDD) implant 746 may be used to form the buried region 52 at which the vertical junction 58 farthest from the isolation region is formed (e.g., the innermost or center vertical junction). The dopant concentration profile of the NLDD implant may be similar to the profile of the implant 744. The n-type dopant provided by the NLDD implant adds to the n-type dopant provided by the well implants 730, 732, 734, 740, and 742 to establish the lowest breakdown voltage for the innermost vertical junction 58. The NLDD implant and the well implants 730, 732, 734, 740, 742 may be configured such that the buried regions 50, 52 have dopant concentration levels on a same order of magnitude at the breakdown junctions. For example, the dopant concentration level of the buried region 50 may be about $6 \times 10^{17}/cm^3$ and the dopant concentration level of the buried region 52 may be about $8 \times 10^{17}/cm^3$. Other dopant concentration levels may be established and used.

FIG. 2 is a plan view of an example diode 200, similar to diode 100. The plan view is simplified, as not all of the regions or structures depicted in FIG. 1 are shown for ease in illustration. For example, the components of the isolation ring that isolates the diode 100 from the remainder of the semiconductor substrate 12 (e.g., DTI regions 34 and substrate tie 36) are shown in simplified form as a single DTI ring. Also, some boundaries of the regions of diode 100 that are illustrated as non-shared boundaries in the embodiment of FIG. 1 are illustrated as shared boundaries in the embodiment of FIG. 2. For example, middle well region 24 is illustrated in FIG. 1 as having non-shared boundaries with isolation region 46 (e.g., the inner and outer boundaries of isolation region 46 extend beyond the inner and outer boundaries of middle well region 24), while middle well region 24 is illustrated in FIG. 2 as having both shared boundaries with isolation region 46 (e.g., the inner and outer boundaries of isolation region fall along the same inner and outer boundaries of middle well region 24). In other embodiments, one or more boundaries of the regions along the surface 40 of the diode 200 may be shared with one or more boundaries of the regions below such structures and regions.

The plan view of FIG. 2 shows one embodiment of how the anode contact region 42 is laterally surrounded by the respective rings of the intermediate anode region 48, the portion 23 of the inner well region 22, the isolation region 46, the cathode contact region 44, and the STI region 38, as well as how the buried region 50 is laterally surrounded by the respective rings of the inner well region 22, the middle well region 24, and the outer well region 60. In the embodiment shown, square-shaped implants are utilized to create the ring-shaped regions, although other shaped implants may be implemented.

The DTI ring (which includes rings of DTI regions 34 and substrate tie 36) is disposed around a periphery of the diode 200 between inner and outer boundaries 240 and 245. The active area 32 of the diode 200 is disposed inward of the inner boundary 240. Working from the center of the active area 32 outward, buried region 52 of the composite cathode region is positioned within boundary 205, illustrated by a broken line indicating that buried region 52 is below the surface 40 of the diode 200. Anode contact region 42 is positioned within boundary 210, illustrated by a solid line indicating that the boundary 210 of anode contact region 42 is visible at surface 40. As shown, anode contact region 42 is centered over buried region 52.

Silicide block 62 is a ring-shaped region that surrounds anode contact region 42. Silicide block 62 is shown as sharing an inner boundary 210 with anode contact region 42 and has an outer boundary 225, illustrated with a solid line indicating that the boundary 225 is visible at surface 40. In other embodiments, silicide block 62 does not share a boundary with anode contact region 42 and instead has an inner boundary within boundary 210 (e.g., silicide block 62 overlaps a portion of anode contact region 42).

Intermediate anode region 48 is a ring-shaped region that also surrounds anode contact region 42. Intermediate anode region 48 shares an inner boundary 210 with anode contact region 42 and has an outer boundary 215, illustrated by a broken line indicating that boundary 215 is below silicide block 62. The portion 23 of inner well region 22 is a ring-shaped region that surrounds intermediate anode region 48. The portion 23 of inner well region 22 shares an inner boundary 215 with intermediate anode region 48 and has an outer boundary 220, illustrated by a broken line indicating that boundary 220 is also below silicide block 62. Isolation region 46 is a ring-shaped region that surrounds the portion 23 of inner well region 22. Isolation region 46 shares an inner boundary 220 with the portion 23 of inner well region 22 and has an outer boundary 230.

Cathode contact region 44 is a ring-shaped region that surrounds isolation region 46. Cathode contact region 44 shares an inner boundary 230 with isolation region 46 and has an outer boundary 235, illustrated as a solid line indicating the boundary is visible at surface 40. STI region 38 is a ring-shaped region that surrounds cathode contact region 44. STI region 38 shares an inner boundary 235 with cathode contact region 44 and shares an outer boundary 240 with the DTI ring.

Buried region 50 is a square-shaped region positioned within boundary 215 and is centered under buried region 52. Buried region 50 is shown as sharing boundary 215 with intermediate anode region 48. In other embodiments, buried region 50 does not share a boundary with intermediate anode region 48 and instead has a boundary within boundary 215 (e.g., buried region 50 extends under the entire anode contact region 42 and a portion of intermediate anode region 48).

Inner well region 22 is a ring-shaped region that surrounds buried region 50. Inner well region 22 shares an inner boundary with buried region 50 and has an outer boundary. Inner well region 22 is shown as sharing boundary 215 and boundary 220 with the portion 23 of inner well region. In other embodiments, inner well region 22 does not share one or more boundaries with the portion 23 of inner well region and instead has an inner boundary within boundary 215 that is shared with buried region 50 (e.g., inner well region 22 extends under a portion of intermediate anode region 48), an outer boundary outside of boundary 220 (e.g., inner well region 22 extends under a portion of isolation region 46), or both.

Middle well region 24 is a ring-shaped region that surrounds inner well region 22. Middle well region 24 shares an inner boundary with inner well region 22 and has an outer boundary. Middle well region 24 is shown as sharing boundary 220 and boundary 230 with isolation region 46. In other embodiments, middle well region 24 does not share one or more boundaries with isolation region 46 and instead has an inner boundary outside of boundary 220 that is shared with inner well region 22 (e.g., inner well region 22 extends under isolation region 46), an outer boundary within boundary 230 (e.g., outer well region 60 extends under a portion of isolation region 46), or both.

Outer well region 60 is a ring-shaped region that surrounds middle well region 24. Outer well region 60 shares an inner boundary with middle well region 24 and shares an outer boundary 240 with the DTI ring. Outer well region 60 extends under the entire cathode contact region 44 and STI region 38. Outer well region 60 is shown as sharing boundary 230 with isolation region 46. In other embodiments, outer well region 60 does not share a boundary with isolation region 46 and instead has an inner boundary within boundary 230 (e.g., outer well also extends under a portion of isolation region 46).

Figure 3:
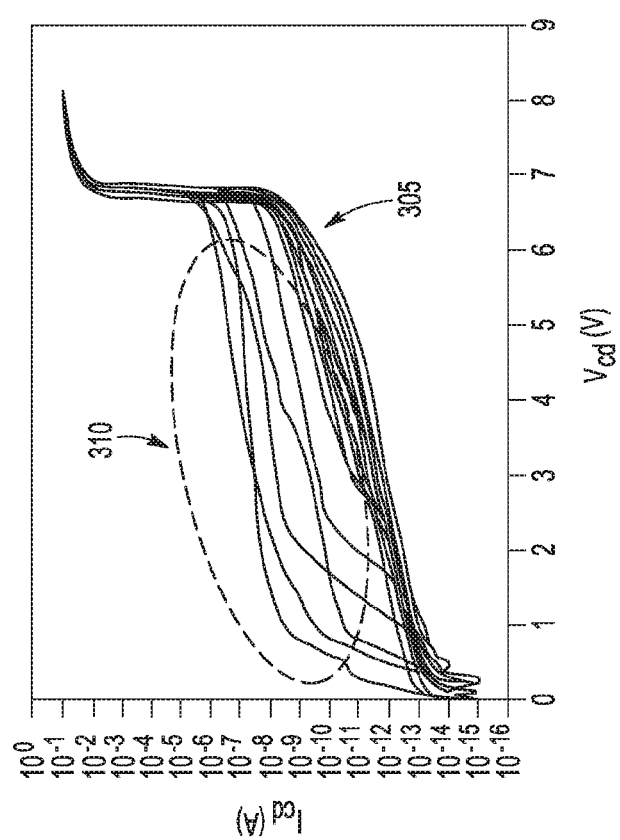

FIG. 3 illustrates a graphical plot depicting example reverse IV curves 305 of diodes that do not have the presently disclosed multiple vertical junctions and lateral junction. For example, the illustrated reverse IV curves 305 are measured for diode arrays having a length of 2 um, a width of 20 um, and 10 fingers. While a majority of curves 305 can be seen to follow a same path, a number of the curves 305 are outlier curves that pass through a region 310, indicating the presence of leakage current. These outlier diodes may not be satisfactory and can result in significant yield loss (e.g., 3-5% of processed devices).

Figure 4:
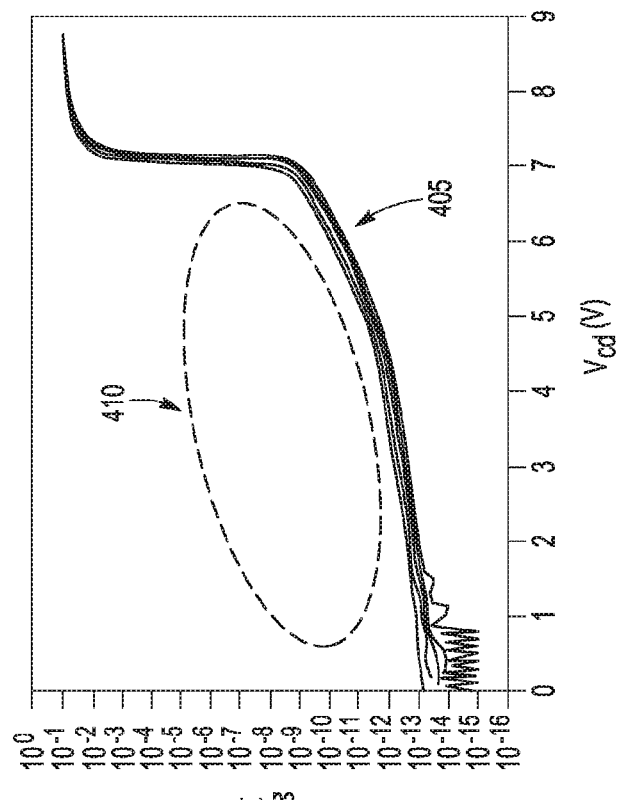
FIG. 3-6 illustrate graphical plots depicting example reverse IV curves of example diodes, according to some embodiments.

FIG. 4 illustrates a graphical plot depicting example reverse IV curves 405 of presently disclosed diodes having multiple vertical junctions and lateral junction (e.g., diode 100 and diode 200). For example, the illustrated reverse IV curves 405 are measured for diode arrays having a length of 2 um, a width of 20 um, and 10 fingers. Curves 405 can be seen to follow a same path, with a greatly reduced number of the curves 405 passing through region 410 (e.g., none in this example), indicating leakage current is not present. It is noted that leakage current may also be affected by different dimensions of the diodes, such as increasing the width (e.g., from 20 um to 30 um). Even in diodes with such different dimensions, the presence of the presently disclosed multiple vertical junctions and lateral junction greatly reduces the resulting leakage current, which results in a greatly reduced number of outlier diodes (e.g., reduces 12% yield loss down to 1% yield loss in such a scenario).

Figure 5:
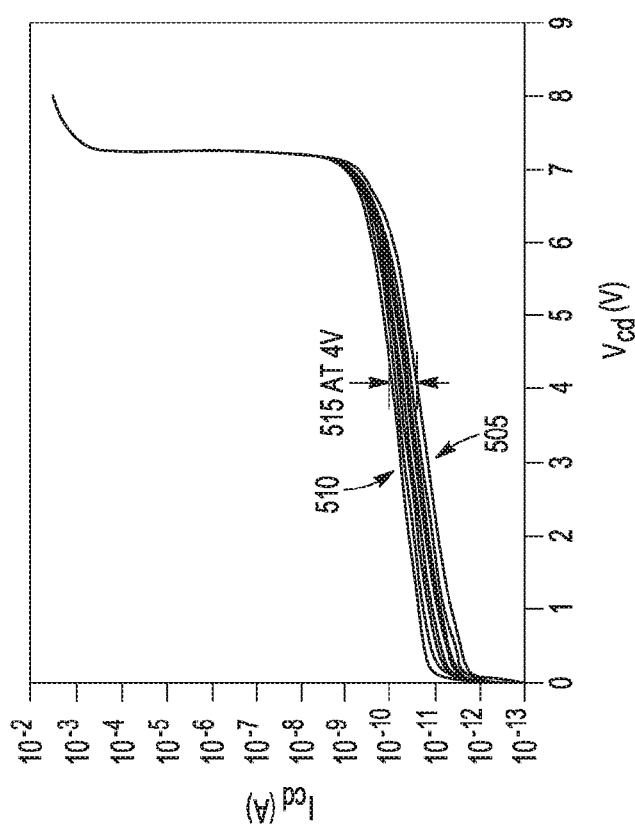

FIG. 5 illustrates a graphical plot depicting example reverse IV curves obtained during a stress test of a diode that does not have the presently disclosed multiple vertical junctions and lateral junction. Example stress conditions include 8V at 150° C. (where the tested diode has a breakdown voltage around 6.7V). The illustrated curves are captured at various points during the stress test (e.g., the stress test is conducted for 10 ksec). An initial curve 505 is captured at the beginning of the stress test, and final curve 510 is captured at the end of the stress test. A differential 515 between the initial curve 505 and final curve 510 is shown at 4V.

Figure 6:
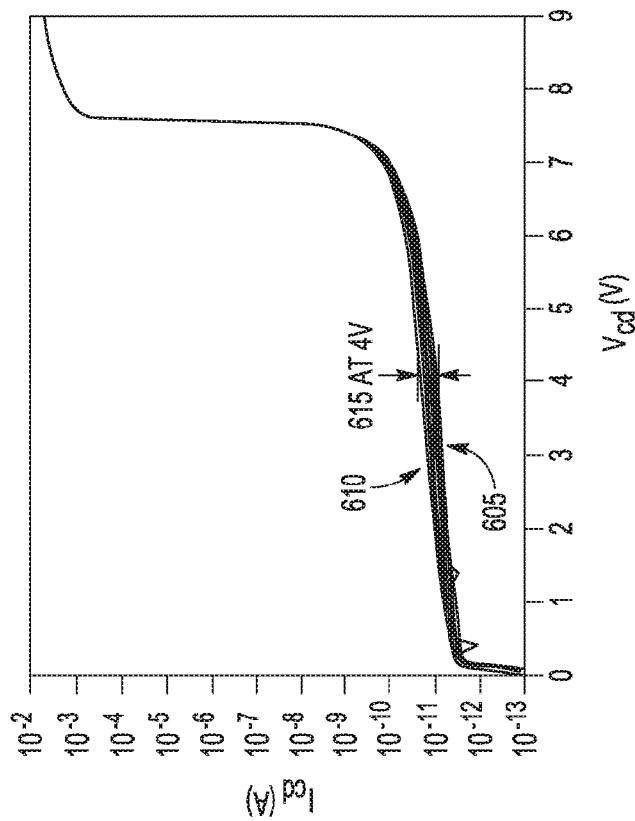

FIG. 6 illustrates a graphical plot depicting example reverse IV curves obtained during a stress test of a diode having the presently disclosed multiple vertical junctions and lateral junction (e.g., diode 100 and diode 200). Example stress conditions include 9V at 150° C. (where the tested diode has a greater breakdown voltage around 7.2V). The illustrated curves are captured at various points during the stress test (e.g., the stress test is conducted for 10 ksec). An initial curve 605 is captured at the beginning of the stress test, and final curve 610 is captured at the end of the stress test. A differential 615 is shown between the initial curve 605 and final curve 610 at 4V, which is much reduced as compared with the differential 515 in FIG. 5. Accordingly, the presence of the presently disclosed multiple vertical junctions and lateral junction improves the stability of the diode, even upon more severe electrical stress.

Figure 7:
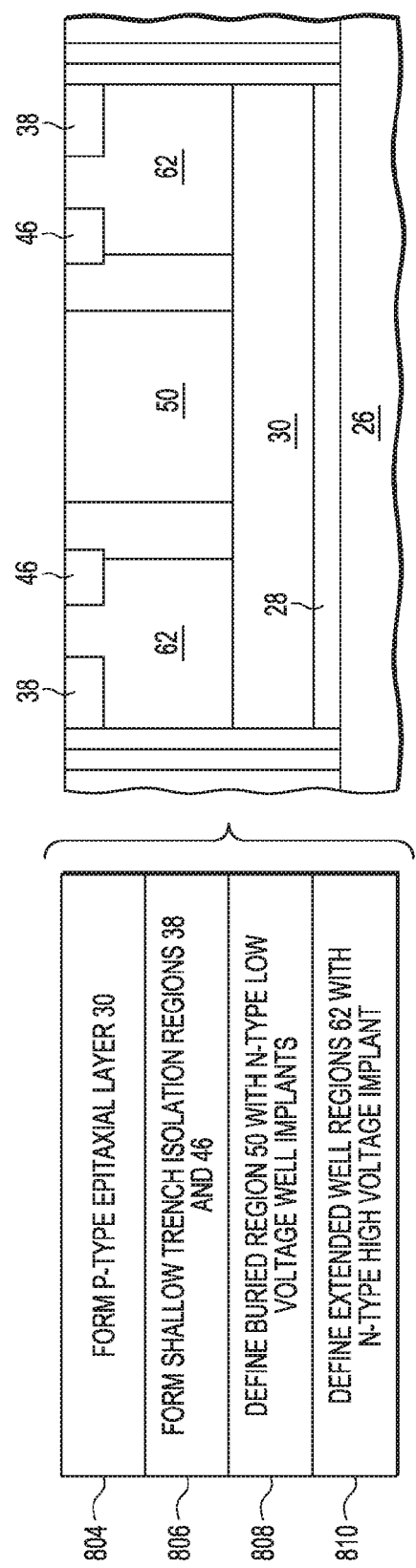
FIG. 7-9 illustrate a flow diagram of an example fabrication sequence to fabricate a diode having multiple junctions in which the disclosure is implemented, according to some embodiments.

FIG. 7 shows an exemplary fabrication method 800 for fabricating an embodiment of the presently disclosed diode having a composite anode region and a composite cathode region with one or more buried cathode regions that implement a number of vertical junctions and a lateral junction, as described above (e.g., diodes 100, 200). The diode is fabricated with a semiconductor substrate, the regions or layers of which may have the conductivity types of the examples described above, or be alternatively configured with the opposite conductivity types. The method includes a sequence of acts or steps, only the salient of which are depicted for convenience in illustration. The fabrication method 800 may be directed to fabricating a number of devices, such as fabricating a diode, a Zener diode, a high voltage or power FET device (e.g., an LDMOS device), a high or low voltage analog FET device, or a low voltage or logic FET device.

The method may begin with, or include, step 804, where the p-type epitaxial layer 30 is grown on a substrate that includes a buried isolation layer 28. The epitaxial layer 30 defines the surface 40 of the semiconductor substrate, which may be an SOI substrate. Any number of epitaxial layers may be grown. In some embodiments, the epitaxial layer 30 is lightly doped p-type. In some embodiments, the epitaxial layer 30 is 3.5 um thick.

The method includes step 806, where the isolation regions 38, 46 or other isolation trenches may be formed at the surface 40 of the semiconductor substrate. The isolation regions 38, 46 may be formed via any now known or hereafter developed procedure. For example, step 806 may include the formation of a trench and the deposition (e.g., chemical vapor deposition, or CVD) of one or more materials in the trench. In some embodiments, the trench is filled with silicon oxide. Additional or alternative materials may be deposited.

The method also includes one or more procedures to define the lateral periphery. Such procedures may include forming one or more deep trench isolation (DTI) regions after formation of the shallow trench isolation (STI) regions (e.g., isolation region 38 in some embodiments, isolation regions 38 and 46 in other embodiments). The DTI regions may be formed via a deep trench formation procedure that includes deep trench etch, trench liner oxidation, trench oxide fill and densification, heavily doped trench poly fill, and deep trench CMP (chemical mechanical polishing).

The method includes step 808, where one or more implantation procedures may be performed to define an area in which the buried region 50 of the composite cathode region will be located. The implantation procedure(s) may be configured as n-type well implantation procedures. In one example, the implantation procedures may include a procedure configured to form a body region of a p-type logic or other low voltage FET device. Alternatively or additionally, the implantation procedures may include a procedure configured to form a body region of a p-type high voltage FET device. Alternatively or additionally, the implantation procedures may include a procedure configured to form a drift or other well region of an n-type power FET device, such as an LDMOS transistor device. Alternatively or additionally, the implantation procedures may include a procedure configured to form an accumulation or other well region of an n-type power FET device, as described above. The same or different dopant ions may be used in the procedures. The implementation procedure(s) may be configured to achieve different dopant concentration profiles as described above. A mask for the implantation procedure(s) may be configured to allow the dopant to be implanted across a central portion of the active device area. The area in which buried region 50 will be located extends laterally across or partially across the constituent regions of the composite anode region to establish multiple junctions, as described above. For example, three implantation procedures may be used (e.g., involving implants 730, 732, and 734).

The method includes step 810, where one or more implantation procedures may be performed to define an extended well region 62 in which middle well region and outer well region will be located. The implantation procedure(s) may be configured as n-type high voltage implantation procedure(s). A mask for the implantation procedure(s) may be configured to allow the dopant to be implanted around a peripheral portion of the active device area. The implantation procedure may be configured to form a body of a p-type high voltage FET device. For example, one implantation procedure may be used (e.g., involving implant 736).

Figure 8:
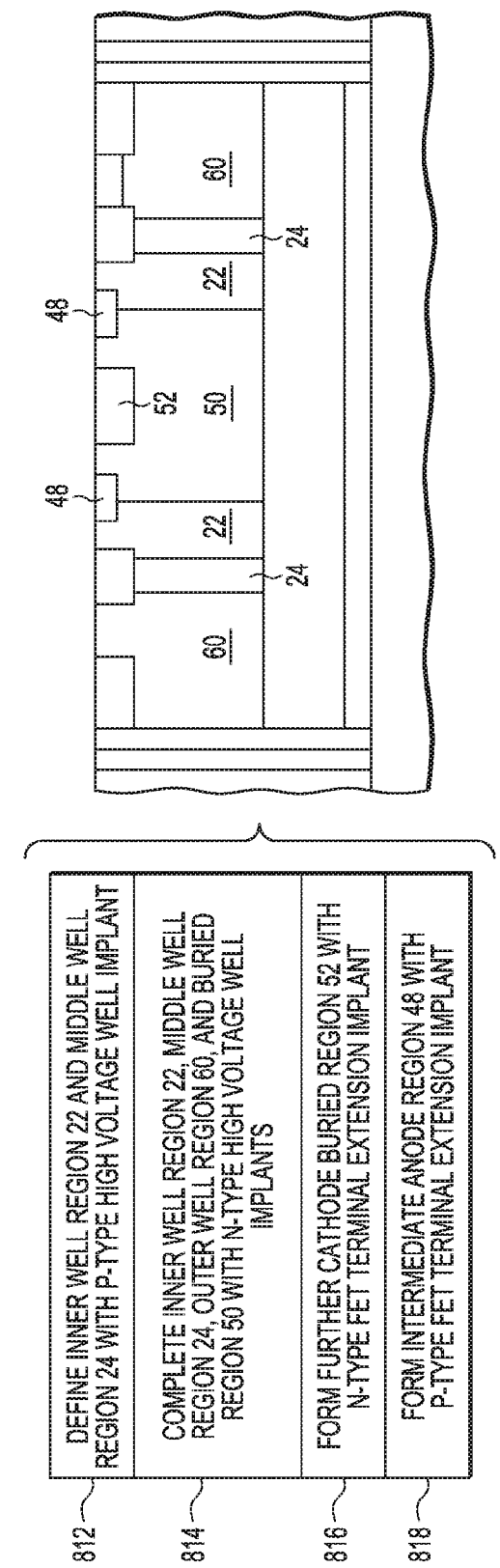

FIG. 8 continues illustration of the method 800. The method includes step 812, where one or more implantation procedures may be performed to define areas in which inner well region 22 and middle well region 24 will be located. The implantation procedure(s) may be configured as p-type high voltage well implantation procedure(s). A mask for the implantation procedure(s) may be configured to allow the dopant to be implanted in an area between the central portion and overlapping an inner portion of the peripheral portion of the active device area. For example, one implantation procedure may be used (e.g., involving implant 738).

The method includes step 814, where one or more implantation procedures may be performed to complete formation of inner well region 22, middle well region 24, outer well region 60, and buried region 50. The implantation procedure(s) may be configured as n-type high voltage well implantation procedure(s). A mask for the implantation procedure(s) may be configured to allow the dopant to be implanted across the entire lateral width of the active area 32. For example, two implantation procedures may be used (e.g., involving implants 740 and 742). The implantation procedures discussed herein may be adjusted to vary the lateral widths of each of inner well region 22, middle well region 24, outer well region 60, and buried region 50, as discussed in the different embodiments above. Also, one or more implantation procedures of method 800 may be omitted to vary the presence of inner well region 22 and middle well region 24 depending on the embodiment being achieved, as also discussed above.

The method includes step 816, where an implantation procedure is performed to form the buried region 52 of the composite cathode region. The implantation procedure may be configured as an n-type power FET terminal extension implantation procedure. For example, the buried region 52 may be formed by performing an LDD implantation procedure (e.g., involving implant 746) to form an NLDD region.

The method includes step 818, where an implantation procedure is performed to form the intermediate anode region 48 of the composite anode region. The implantation procedure may be configured as a p-type power FET terminal extension implantation procedure. For example, the intermediate anode region 48 may be formed by performing an LDD implantation procedure (e.g., involving implant 744) to form a PLDD region. The implantation procedure is configured such that the intermediate anode region 48 extends laterally across or partially across the buried region 50 to establish the outer vertical junction 54 of the diode, as described above. The implantation procedure may be configured to establish the outer vertical junction 54 with the intermediate anode region 48 at a shallower depth than a depth of anode contact region 42 (which is subsequently formed in step 824), as described above.

Figure 9:
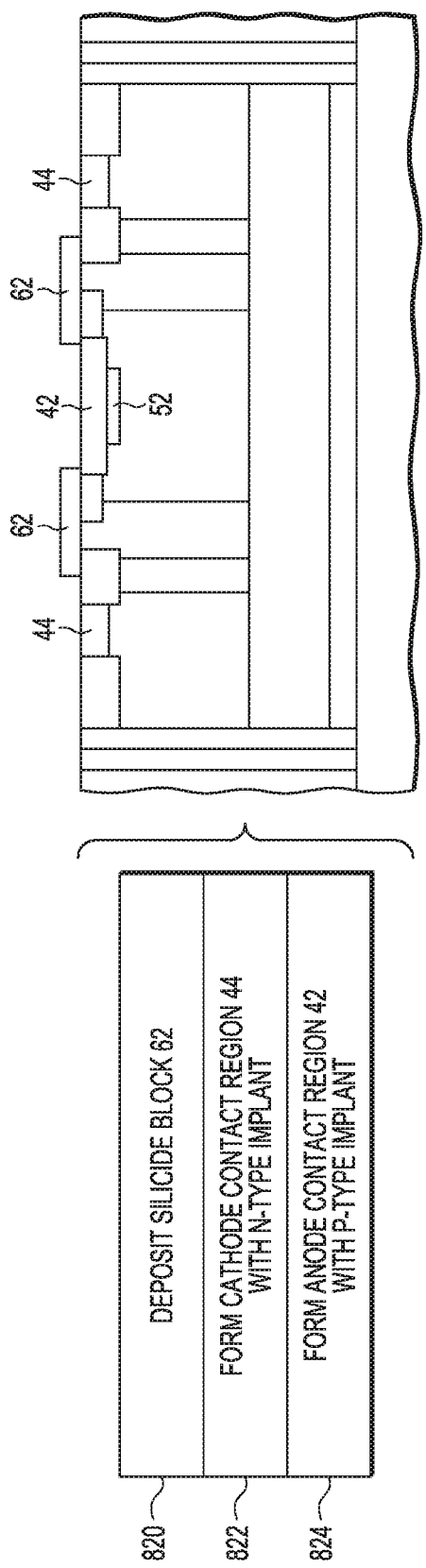

FIG. 9 continues illustration of the method 800. The method includes step 820, where silicide block 62 is deposited on the surface of the substrate over the intermediate anode region 48, the portion 23 of inner well region 22, and a portion of isolation region 46, as described above. Silicide block 62 is deposited over the lateral junction 20 between the intermediate anode region 48 and the portion 23 of inner well region 22. One or more materials may be deposited. For example, silicon dioxide and silicon nitride may be used.

The method includes step 822, where an implantation procedure is performed to form the cathode contact region 44. The implantation procedure may be configured as an n-type implantation procedure to form n-type source/drain regions of FET device. The cathode contact region 44 may be disposed laterally outward of the isolation region 46 as described above. The cathode contact region 44 may be formed in or on the outer well region 60.

The method includes step 824, where an implantation procedure is performed to form the anode contact region 42 of the composite anode region. The implantation procedure is configured such that the anode contact region 42 is electrically connected with the intermediate anode region 48. The implantation procedure may be configured as a p-type implantation procedure to form p-type source/drain regions of FET devices. In this embodiment, the silicide block 62 is used as a hard mask for the implantation procedure. The implantation procedure is configured such that the anode contact region 42 extends laterally across buried region 52 to establish the inner vertical junction 58 of the diode, and the anode contact region 42 extends laterally across or partially across the buried region 50 to establish middle vertical junction 56 of the diode, as described above. As also described above, the inner vertical junction has a lower breakdown voltage than the middle and outer vertical junctions.

The ordering of the steps or acts of method 800 may vary in other embodiments. Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed. The procedures may be implemented in various orders. Additional or alternative procedures may be implemented.

By now it should be appreciated that there has been provided a diode having multiple vertical junctions and lateral junction utilizing implantation procedures used to fabricate FET devices, resulting in a more robust diode. In one embodiment of the present disclosure, a diode is provided, which includes a semiconductor substrate having a surface; a first contact region disposed at the surface of the semiconductor substrate and having a first conductivity type; a second contact region disposed at the surface of the semiconductor substrate, laterally spaced from the first contact region, and having a second conductivity type. The diode also includes a buried region disposed in the semiconductor substrate, the buried region vertically adjacent to the first contact region, the buried region having the second conductivity type, and electrically connected with the second contact region; an isolation region disposed at the surface of the semiconductor substrate between the first contact region and the second contact region; and a separation region disposed at the surface of the semiconductor substrate between the first contact region and the isolation region, the separation region formed from a portion of first well region disposed in the semiconductor substrate that extends to the surface.

One aspect of the above embodiment provides that an inner vertical junction is established at an interface between the first contact region and the buried region.

Another aspect of the above embodiment provides that a lateral junction is established at an interface between a lateral edge of the first contact region and the separation region.

Another aspect of the above embodiment provides that the diode further includes an intermediate region disposed at the surface of the semiconductor substrate between the first contact region and the separation region, electrically connected with the first contact region, and having the first conductivity type, wherein the intermediate region includes one or more regions disposed at the surface of the semiconductor substrate and electrically connected with the first contact region.

A further aspect of the above embodiment provides that a lateral junction is established at an interface between a lateral edge of the intermediate region and the separation region.

Another aspect of the above embodiment provides that the first well region is centered under the first contact region and extends laterally across at least a portion of the first contact region, and a vertical junction is established at an interface between the first contact region and the first well region.

Another aspect of the above embodiment provides that the diode further includes: a centered well region disposed in the semiconductor substrate centered under the first contact region, the centered well region is vertically adjacent to the buried region, the centered well region extends laterally across at least a portion of the buried region, wherein the first well region is laterally adjacent to the centered well region.

A further aspect of the above embodiment provides that the centered well region further extends laterally across at least a portion of the first contact region, and a vertical junction is established at an interface between the first contact region and the centered well region.

Another further aspect of the above embodiment provides that the diode further includes: an intermediate region disposed at the surface of the semiconductor substrate laterally adjacent between the first contact region and the separation region, electrically connected with the first contact region, and having the first conductivity type, wherein the centered well region further extends laterally across at least a portion of the intermediate region, and a vertical junction is established at an interface between the intermediate region and the centered well region.

Another aspect of the above embodiment provides that the diode further includes: a second well region disposed in the semiconductor substrate under at least a portion of the isolation region and laterally adjacent to the first well region, having the second conductivity type, and electrically connected to the second contact region, wherein the second well region has a higher dopant concentration than the first well region.

A further aspect of the above embodiment provides that the diode further includes: a third well region disposed in the semiconductor substrate laterally adjacent to the second well region, having the second conductivity type, and electrically connected to the second contact region, wherein the third well region has a higher dopant concentration than the second well region.

Another aspect of the above embodiment provides that the diode further includes: an outer well region disposed in the semiconductor substrate under at least a portion of the second contact region and laterally adjacent to the first well region, having the second conductivity type, and electrically connected to the second contact region, wherein the outer well region has a higher dopant concentration than the first well region.

Another aspect of the above embodiment provides that the isolation region includes a shallow trench isolation (STI) region.

Another aspect of the above embodiment provides that the diode further includes: a silicide block supported by the semiconductor substrate and disposed over the separation region.

Another aspect of the above embodiment provides that the diode includes one of a group including a Zener diode and a low voltage diode.

In another embodiment of the present disclosure, a method of fabricating a diode in a device area on a semiconductor substrate is provided, which includes: forming an isolation region disposed at a surface of the semiconductor substrate; performing a first dopant implantation procedure to form a first well region disposed in the semiconductor substrate, wherein the first well region has a first conductivity type, and the first well region includes a portion of the first well region that extends to the surface of the semiconductor substrate; performing a second dopant implantation procedure to form a buried region disposed in the semiconductor substrate, wherein the buried region has the first conductivity type; performing a third dopant implantation procedure to form a first contact region disposed at the surface of the semiconductor substrate, wherein the first contact region has the first conductivity type, and the first, second, and third dopant implantation procedures are configured such that the buried region is electrically connected with the first contact region; and performing a fourth dopant implantation procedure to form a second contact region disposed at the surface of the semiconductor substrate, wherein the second contact region has a second conductivity type, the second contact region is vertically adjacent to the buried region, the isolation region is laterally disposed between the second contact region and the first contact region, and the portion of the first well region forms a separation region that is laterally disposed between the second contact region and the isolation region.

One aspect of the above embodiment provides that the method further includes: performing a fifth dopant implantation procedure to form an intermediate region disposed at the surface of the semiconductor substrate, wherein the intermediate region has the second conductivity type, and the fourth and fifth dopant implantation procedures are configured such that: the intermediate region is laterally adjacent to the second contact region, and the intermediate region is electrically connected with the second contact region.

A further aspect of the above embodiment provides that the intermediate region is further laterally adjacent to the separation region, and a lateral junction is established at an interface between a lateral edge of the intermediate region and the separation region.

Another aspect of the above embodiment provides that the performing the first dopant implantation procedure further forms a centered well region disposed in the semiconductor substrate centered within the device area, wherein the centered well region is vertically adjacent to the buried region, the buried region is also centered within the device area, the centered well region extends laterally across at least a portion of the buried region, and the first well region is laterally adjacent to the centered well region.

Another aspect of the above embodiment provides that the method further includes: depositing a silicide block on the surface of the semiconductor substrate over the separation region.

The diode described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of fabricating a diode in a device area on a semiconductor substrate, the method comprising:
    forming an isolation region disposed at a surface of the semiconductor substrate;
    performing a first dopant implantation procedure to form a first well region disposed in the semiconductor substrate, wherein
        the first well region has a first conductivity type, and
        the first well region includes a portion of the first well region that extends to the surface of the semiconductor substrate;
    performing a second dopant implantation procedure to form a buried region disposed in the semiconductor substrate, wherein
        the buried region has the first conductivity type;
    performing a third dopant implantation procedure to form a first contact region disposed at the surface of the semiconductor substrate, wherein
        the first contact region has the first conductivity type, and
        the first, second, and third dopant implantation procedures are configured such that the buried region is electrically connected with the first contact region; and
    performing a fourth dopant implantation procedure to form a second contact region disposed at the surface of the semiconductor substrate, wherein
        the second contact region has a second conductivity type,
        the second contact region is vertically adjacent to the buried region,
        the isolation region is laterally disposed between the second contact region and the first contact region, and
        the portion of the first well region forms a separation region that is laterally disposed between the second contact region and the isolation region.

2. The method of claim 1, further comprising:
    performing a fifth dopant implantation procedure to form an intermediate region disposed at the surface of the semiconductor substrate, wherein
        the intermediate region has the second conductivity type, and
        the fourth and fifth dopant implantation procedures are configured such that:
            the intermediate region is laterally adjacent to the second contact region, and
            the intermediate region is electrically connected with the second contact region.

3. The method of claim 2, wherein
    the intermediate region is further laterally adjacent to the separation region, and
    a lateral junction is established at an interface between a lateral edge of the intermediate region and the separation region.

4. The method of claim 1, wherein
    the performing the first dopant implantation procedure further forms a centered well region disposed in the semiconductor substrate centered within the device area, wherein
        the centered well region is vertically adjacent to the buried region,
        the buried region is also centered within the device area,
        the centered well region extends laterally across at least a portion of the buried region, and
        the first well region is laterally adjacent to the centered well region.

5. The method of claim 1, further comprising:
    depositing a silicide block on the surface of the semiconductor substrate over the separation region.

6. The method of claim 1, wherein
    an inner vertical junction is established at an interface between the second contact region and the buried region.

7. The method of claim 1, wherein
    a lateral junction is established at an interface between a lateral edge of the second contact region and the separation region.

8. The method of claim 1, wherein
    the second contact region is centered over the first well region,
    the second contact region extends laterally across at least a portion of the first well region, and
    a vertical junction is established at an interface between the second contact region and the first well region.

9. The method of claim 4, wherein
at least a portion of the second contact region extends laterally across the centered well region, and
a vertical junction is established at an interface between the second contact region and the centered well region.

10. The method of claim 4, further comprising:
performing a fifth dopant implantation procedure to form an intermediate region disposed at the surface of the semiconductor substrate, wherein the first and fifth dopant implantation procedures are configured such that:
   at least a portion of the intermediate region extends laterally across the centered well region, and
   a vertical junction is established at an interface between the intermediate region and the centered well region.

11. The method of claim 1, wherein
the performing the first dopant implantation procedure further forms a second well region disposed in the semiconductor substrate under at least a portion of the isolation region and laterally adjacent to the first well region, wherein
   the second well region has the first conductivity type,
   the first and third dopant implantation procedures are configured such that the second well region is electrically connected to the first contact region, and
   the second well region has a higher dopant concentration than the first well region.

12. The method of claim 11, wherein
the performing the first dopant implantation procedure further forms a third well region disposed in the semiconductor substrate laterally adjacent to the second well region, wherein
   the third well region has the first conductivity type,
   the first and third dopant implantation procedures are further configured such that the third well region is electrically connected to the first contact region, and
   the third well region has a higher dopant concentration than the second well region.

13. The method of claim 1, wherein
the performing the first dopant implantation procedure further forms an outer well region disposed in the semiconductor substrate under at least a portion of the first contact region and laterally adjacent to the first well region, wherein
   the outer well region has the first conductivity type,
   the first and third dopant implantation procedures are further configured such that the outer well region is electrically connected to the first contact region, and
   the outer well region has a higher dopant concentration than the first well region.

14. The method of claim 1, wherein the isolation region comprises a shallow trench isolation (STI) region.

15. The method of claim 1, wherein the diode comprises one of a group including a Zener diode and a low voltage diode.

* * * * *